(12) United States Patent
Cygan et al.

(10) Patent No.: US 7,825,724 B2
(45) Date of Patent: Nov. 2, 2010

(54) METHOD AND APPARATUS FOR DIRECT DIGITAL TO RADIO FREQUENCY CONVERSION

(75) Inventors: Lawrence F. Cygan, Schaumburg, IL (US); Curtis M. Williams, Schaumburg, IL (US); Andrew M. Khan, Schaumburg, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 140 days.

(21) Appl. No.: 11/958,978

(22) Filed: Dec. 18, 2007

(65) Prior Publication Data

US 2009/0153242 A1  Jun. 18, 2009

(51) Int. Cl.
*H03F 3/38* (2006.01)

(52) U.S. Cl. ............... 330/10; 330/251; 330/207 A

(58) Field of Classification Search ............ 330/10, 330/251, 207 A
See application file for complete search history.

(56) References Cited

U.S. PATENT DOCUMENTS

| | | | | |
|---|---|---|---|---|
| 5,398,003 | A * | 3/1995 | Heyl et al. ................ 330/10 |
| 5,617,058 | A * | 4/1997 | Adrian et al. ............. 330/10 |
| 6,351,184 | B1 * | 2/2002 | Miao et al. ............ 330/207 A |
| 6,472,933 | B2 * | 10/2002 | Hsu ..................... 330/10 |
| 6,697,271 | B2 | 2/2004 | Corzine |
| 6,977,546 | B2 | 12/2005 | Stapleton |
| 6,977,564 | B2 | 12/2005 | Kanba et al. |
| 7,492,217 | B2 * | 2/2009 | Hansen et al. ............. 330/10 |
| 7,576,605 | B2 * | 8/2009 | Lee et al. ................. 330/10 |
| 2002/0097085 | A1 | 7/2002 | Stapleton |
| 2003/0210746 | A1 | 11/2003 | Asbeck et al. |
| 2005/0162222 | A1 | 7/2005 | Hezar et al. |
| 2006/0044057 | A1 | 3/2006 | Hezar et al. |
| 2006/0188027 | A1 | 8/2006 | Jeckeln et al. |
| 2008/0278209 | A1 * | 11/2008 | Kim .................... 327/175 |

OTHER PUBLICATIONS

Jayaraman, Arun et al.: "Linear High-Efficiency Microwave Power Amplifiers Using Bandpass Delta-Sigma Modulators", IEEE Microwave and guided wave letters, vol. 8, No. 3, Mar. 31, 1998, all pages.

* cited by examiner

*Primary Examiner*—Patricia Nguyen

(57) ABSTRACT

A method and apparatus for direct conversion of digital data to high power RF signals, known as DDRF. The method and apparatus receive a digital signal, create a digital modulated signal therefrom, and amplify the modulated signal with an H-bridge Power Amplifier for transmission. DDRF uses a multi-level H-bridge amplification circuit to establish a more power efficient digital transmitter.

20 Claims, 16 Drawing Sheets

CURRENT FLOW FOR "-1" STATE

CURRENT FLOW FOR "+1" STATE

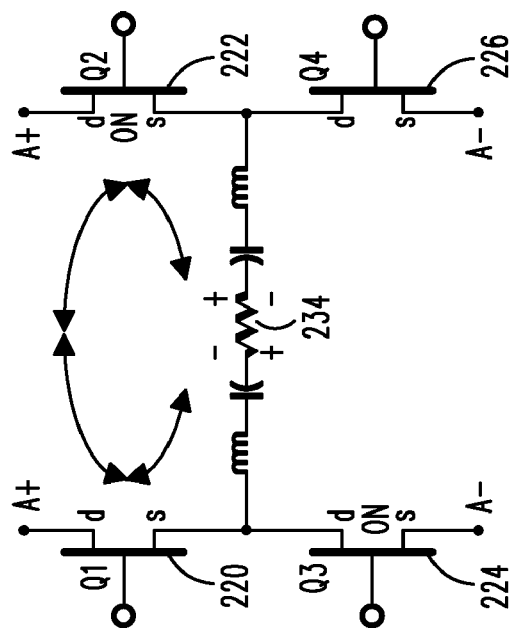
FIG. 2E  CURRENT FLOW FOR ALTERNATE "0" STATE ("ACTIVE COMMUNICATION")
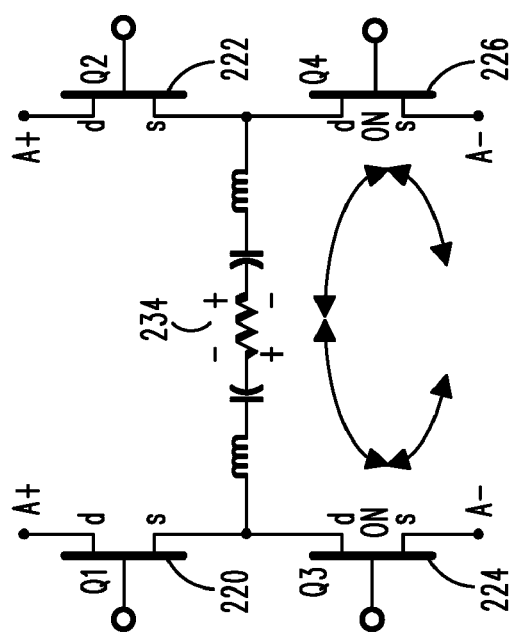
FIG. 2D  CURRENT FLOW FOR "0" STATE ("ACTIVE COMMUNICATION")

LEFT SIDE OF MULTI-LEVEL H-BRIDGE

METHOD AND APPARATUS FOR DIRECT DIGITAL TO RADIO FREQUENCY CONVERSION

FIELD OF THE INVENTION

The present invention relates generally to telecommunication and power amplification. The invention relates, more particularly, to conversion of digital data to high power RF signals and to power amplification systems suitable for use in high efficiency RF equipment.

BACKGROUND

The development of highly efficient radio transmitters has been an objective of engineers since the 1930's. Recent developments in digital signal processing hardware have made possible the generation of multi-gigabit-per-second serial data streams. Such high speed data streams have been investigated for use as the driving waveform in high efficiency transmitters, in particular those employing switch mode Radio Frequency (RF) power amplifiers. An extension of this concept is the development of a transmitter which efficiently converts digital information directly to a radio frequency signal. Thus, there has been a push not only for highly efficient transmitters, but also for the ability to transition directly from a digital signal to a radio frequency signal.

An example of a Direct Digital to RF (hereinafter "DDRF") transmitter is shown in FIG. 1. In such systems, I and Q information is converted through a digital signal processor (DSP) 102 into a format that is acceptable by a delta-sigma modulator 104. The delta-sigma modulator 104, usually a band-pass delta-sigma modulator, is used to create a binary drive waveform 106 (as shown by the binary output 106a, two-state, serial representation) which has desirable noise properties, such as a noise notch, in the vicinity of the carrier frequency as shown in the Delta-Sigma Output Spectrum 106b. This waveform is coupled to an efficient power amplifier configured in a basic H-Bridge 126 format as is used in digital audio or motor controller applications. The two-state drive causes current to flow in alternating directions through the load 128 presented to the H-Bridge Power Amplifier, thus developing an amplified version of the desired RF output 130.

The operation of the H-bridge Power Amplifier 126 proceeds as follows: The binary output 106a of the Delta-Sigma Modulator determines which Field Effect transistors (hereinafter "FETs") are turned on or off. The binary signal is applied to the inputs of two inverting and two non-inverting driver stages. The driver outputs determine the gate-source voltage applied to each of the FETs, and are so configured as to permit only one diagonally opposite pair of FETs to be turned on at any given time. As an example, if a plus-one is transmitted to the H-bridge Power Amplifier 126, the $FET_1$ 132 and the $FET_4$ 136 are turned on. As a result, current flows from $FET_1$ 132 through the load 128 to $FET_4$ 136. When a minus-one (−1) is transmitted to the H-bridge Power Amplifier 126, the $FET_2$ 134 and the $FET_3$ 138 are turned on. This causes current to flow from $FET_2$ 134 through the load 128 to $FET_3$ 138. As can be seen, the current through the load 128 changes direction as the different pairs of FETs, 132 and 136 or 134 and 138, are turned on and off. This operation provides an alternating current to the load and delivers power to the load.

The signaling scheme described is a "+1" "−1" waveform. The rapid rise and fall times of such "square-edged" waveforms allow operation of the Power Amplifier (hereinafter "PA") devices (bipolar or FET) as idealized switches. Such an operation minimizes the power dissipation within the PA devices, leading to significant drain (or collector) efficiency improvement over that attained using traditional "sinusoidal" driving functions. The bandwidth of the "+1" "−1" waveform greatly exceeds that of the desired transmission channel bandwidth, extending from DC to at least 4 times the carrier frequency. Because of this bandwidth, a suitable band-pass filter is placed at the PA output to reject the unwanted off-channel energy and prevent such components from contributing to the "DC input" power required by the PA. In this regard, the H-bridge 126 has the unique property of being able to accept a broadband drive signal yet discriminate against the DC input components corresponding to those spectral components which exist outside of the desired channel bandwidth. This acceptance of a broadband signal and discrimination of the DC input components is accomplished by the four device PA topology in conjunction with band pass filtering placed in series with the load. The DC component dissipated by the PA is restricted to that necessary to support the portion of the spectrum which is associated with the on-channel signal.

The binary output 106a of delta-sigma modulator is an undesirable driving waveform for RF applications. The two signal states represented by the plus-one (+1) minus-one (−1) waveform transfers a constant level of drive power to the PA, regardless of the signal amplitude delivered to the load 128. As many modulation systems such as CDMA and OFDM statistically spend much time at low power levels, the constant drive of the binary waveform implies the stage gain of the power amplifier will be low. In turn, the low gain requires significant drive power to be applied to the PA, resulting in low efficiency operation of the overall system. The need is therefore established for a direct digital to RF transmitter wherein the gain of the PA is maintained at a high level to promote high efficiency operation.

BRIEF DESCRIPTION OF THE FIGURES

The accompanying Figures, where like reference numerals refer to identical or functionally similar elements throughout the separate views and which together with the detailed description below, are incorporated in and form part of the specification, serve to further illustrate various embodiments and to explain various principles and advantages all in accordance with the present invention.

FIGS. 2B-2E are exemplary representations of the operation of the 3-level H-bridge.

Figure 1:
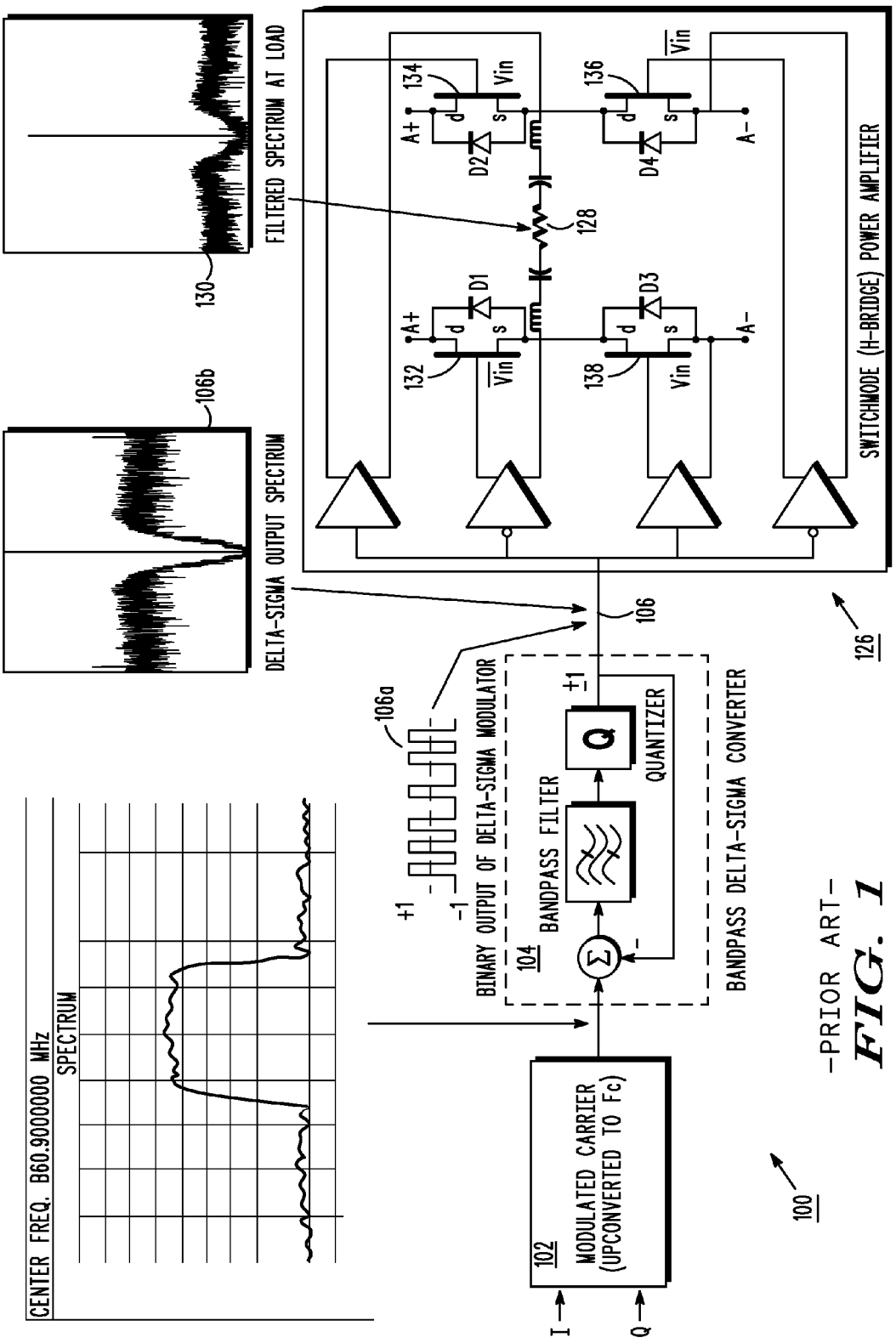
FIG. 1 is a prior art digital to radio frequency transmitter system incorporating a band-pass Delta-Sigma Converter and a basic H-bridge Power Amplifier.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail various embodiments in accordance with the present invention, it should be observed that the embodiments reside primarily in combinations of method steps and apparatus components related to Direct Digital to Radio Frequency ("DDRF") conversion and transmission. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of Direct Digital to RF conversion described herein. The non-processor circuits may include, but are not limited to, a radio receiver, a radio transmitter, signal drivers, clock circuits, power source circuits, and user input devices. As such, these functions may be interpreted as steps of a method to perform direct digital to RF conversion. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Methods for receiving a digital signal, converting it to a radio frequency signal and amplifying it for transmission are disclosed. Various methods include receiving a digital signal, creating a modulated signal therefrom, and amplifying the modulated signal with an H-bridge Power Amplifier. The various methods further include the transmitting of an amplified modulated signal.

Systems for receiving a digital signal, converting it to a radio frequency signal and amplifying the radio frequency signal for transmission are also disclosed. The systems may include a device for receiving a digital signal; a device for converting the signal into a modulated signal, and a device for amplifying the signal. The systems further include a transmitter for transmitting the amplified signal.

Referring now to FIG. 1, a prior art digital to radio frequency transmitter system incorporating a band-pass Delta-Sigma Converter and an H-bridge Power Amplifier is depicted. The digital to radio frequency system 100 includes an input for a modulated carrier 102 coming from standard digital processing (not shown). The modulated carrier is passed through a Delta-Sigma Converter 104. The Delta-Sigma Converter 104 can be a band-pass Delta-Sigma Converter. The Delta-Sigma Converter 104 outputs a binary drive waveform 106 that has a plus-one (+1) and minus-one (−1) amplitude. The binary drive waveform 106 has a time domain Binary output 106a and a corresponding Frequency Domain output 106b. The binary drive waveform 106 is input into an H-bridge amplifier 126.

The H-bridge amplifier 126 typically includes four drivers connected to FET devices. As the binary output 106a of the Delta-Sigma Modulator 104 is input into the H-bridge Power Amplifier 126, the various devices, bipolar or FET, are directed by the binary output 106a to turn off and on. As an example, if a plus-one (+1) is transmitted to the H-bridge Power Amplifier 126, the $FET_1$ 132 and the $FET_4$ 136 are turned on. As a result, current flows from $FET_1$ 132 through the load 28 to $FET_4$ 136. When a minus-one (−1) is transmitted to the H-bridge Power Amplifier 126, the $FET_2$ 134 and the $FET_3$ 138 are turned on. The turning from "off" to "on" of $FET_2$ 134 and $FET_3$ 138 causes current to flow from $FET_2$ 134 through the load 128 to $FET_3$ 138. As can be seen, the current through the load 128 changes direction as the different pairs of FETs, 132 and 136, or 134 and 138 are turned on and off. This operation provides an alternating current to the load and delivers power to the load 128.

The H-bridge 126 has the unique property of being able to accept a broadband signal as its input, while restricting DC input power to only that which is necessary to support a desired narrowband output. This unique property is accomplished by use of the four-device H-Bridge PA topology in conjunction with band pass filtering placed in series with the load 128. The band pass filter rejects unwanted off-channel energy and prevents such frequency components from contributing to the DC input power required by the PA.

Since only a small fraction of the total broadband signal applied to the PA falls within the desired pass-band around the carrier, the effective gain of the prior art H-bridge PA stage is low. While the drain (or collector) efficiency of the H-Bridge PA 126 may be acceptable, the overall system 100 efficiency expressed as Power-Added Efficiency ("PAE") is poor, due to the low gain of the PA stage (see equation 1).

$$PAE = \frac{PO(1 - 1/G)}{DC\_input} \quad \text{(eqn. 1)}$$

In equation 1, where PO is Power Output, Power Added Efficiency is seen to depend on the gain G of the H-bridge 126 amplifier stage as well the conversion efficiency of DC to RF power. For large values of G, PAE numerically approaches the value obtained for drain (or collector) efficiency formed by the ratio:

$$\eta_{drain} = \frac{PO}{DC\_input}$$

Through extensive simulation and derivation efforts, insight into the operation of the delta-sigma converter 104 has been advanced. This is provided by equation 2 in the expression:

$$PAR_{input} + |C_{BO}| = PAR_{output} + |\eta_{ALG}| \quad \text{(eqn. 2)}$$

$PAR_{input}$ refers to the peak-to-average ratio of the signal applied to the input of the delta-sigma converter 104. Since this is a representation (digital or analog) of the desired on-channel signal, $PAR_{input}$ is identical to analog PAR associated with the signal's modulation. $C_{BO}$ represents the coding back-off required to maintain numeric stability of the feedback loop used by the delta-sigma converter 104 to provide the noise notch around the carrier. This quantity is a negative dB value of which the absolute value is taken for use in the equation. $PAR_{output}$ is the peak-to-average ratio of the binary drive waveform 106 produced at the output of the delta-sigma converter 104, also expressed in dB. Finally, the quantity $\eta_{ALG}$ is termed algorithmic efficiency and is defined as:

$$\eta_{ALG} = \frac{PO_{ON\text{-}CHANNEL}}{PO_{ON\text{-}CHANNEL} + PO_{OFF\text{-}CHANNEL}}$$
$$= \frac{PO_{ON\text{-}CHANNEL}}{TotalPowerGenerated}$$

Algorithmic efficiency provides a figure of merit relating the ability of the delta-sigma converter 104 to produce the desired signal while generating minimal off-channel spectral components. $\eta_{ALG}$ is represented as a negative dB value. Its absolute value is used in equation 2.

The significance of equation 2 will be illustrated using numerical values for the four quantities defined above. In the case of a CDMA carrier which is converted to a binary signaling representation, typical values are $PAR_{input}$=6.0 dB and $C_{BO}$=−1.9 dB. Since the binary drive waveform 106 output of the delta-sigma converter 104 is a constant envelope signal, $PAR_{output}$=0 dB. Solving for the algorithmic efficiency term, $|\eta_{ALG}|$ has the value 7.9 dB. $\eta_{ALG}$ subtracts directly from the gain which the H-bridge PA 126 would normally exhibit under narrowband, analog conditions. Thus, an H-bridge PA 126 exhibiting 10 dB of narrowband gain operates at a reduced gain of 2.1 dB gain (10−7.9=2.1 dB) resulting from the process of converting CDMA to a binary format.

Binary signaling can only produce two non-zero states (e.g. a plus-one and a minus-one signal), implying the total power generated ($PO_{ON\ CHANNEL}+PO_{OFF\ CHANNEL}$) must remain constant. To create the desired on-channel CDMA signal, which has a time varying envelope, binary signaling must transfer power between on-channel and off-channel spectral components. This is accomplished by modulating the edge positions of the binary waveform as it transitions between the two states (which is essentially the only degree of freedom available). While the constant total power generated ($PO_{ON\ CHANNEL}+PO_{OFF\ CHANNEL}$) is applied to the H-bridge PA 126 input, only $PO_{ON\ CHANNEL}$ is delivered to the load 128. The gain of the H-bridge PA 126 stage is therefore reduced by the algorithmic efficiency as calculated above.

In contrast, a conventional analog representation of CDMA does not involve conversion to binary signaling. In equation 2, the absence of a delta-sigma converter 104 implies $C_{BO}$=0 dB. Since all power generated in an analog system is on-channel power, $\eta_{ALG}$=0 dB. Thus, $PAR_{output}$=$PAR_{input}$ since they are one in the same quantity. The hypothetical stage gain of 10 dB is preserved in an analog system. The analog representation of CDMA must be amplified to a practical output level in an analog linear amplifier, however. Such amplifier designs operate at low efficiency levels which are substantially poorer than those of switch-mode power amplifiers.

Revisiting equation 2, a technique for improving the algorithmic efficiency is necessary if a high efficiency digital transmitter is to be realized. The equation indicates this may be accomplished by increasing $PAR_{OUTPUT}$ for a given $PAR_{INPUT}$ and $C_{BO}$. This presents a dilemma in that the switch-mode PA accepts only constant envelope, e.g., the plus-one (+1) minus-one (−1) discussed hereinabove. Application of non-constant envelope drive would force the switch-mode PA to spend time in the active region, where internal dissipation increases, resulting in poor efficiency.

Figure 2A:
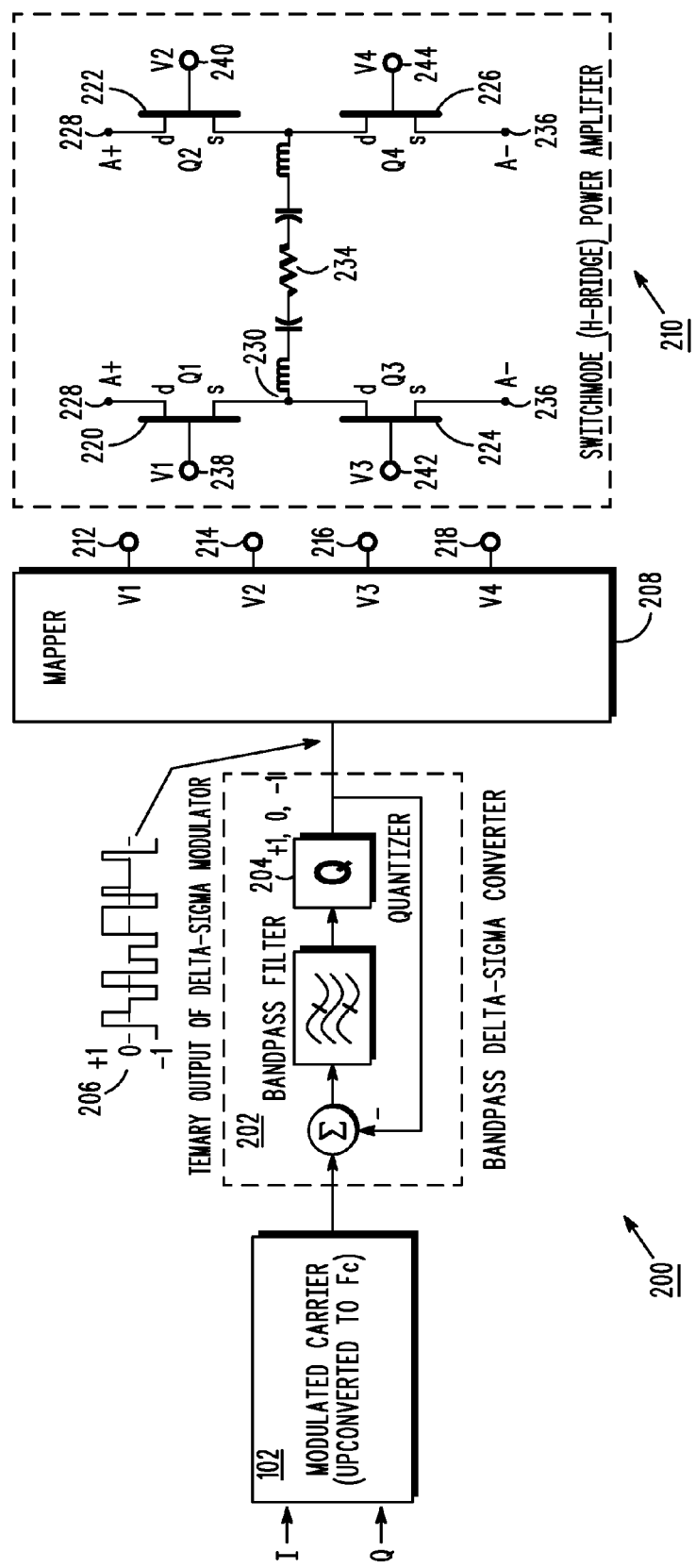
FIG. 2A is an exemplary digital to radio frequency transmitter system with a multi-level delta-sigma modulator, a level select logic mapper and a 3-level H-bridge.
Figure 2C:
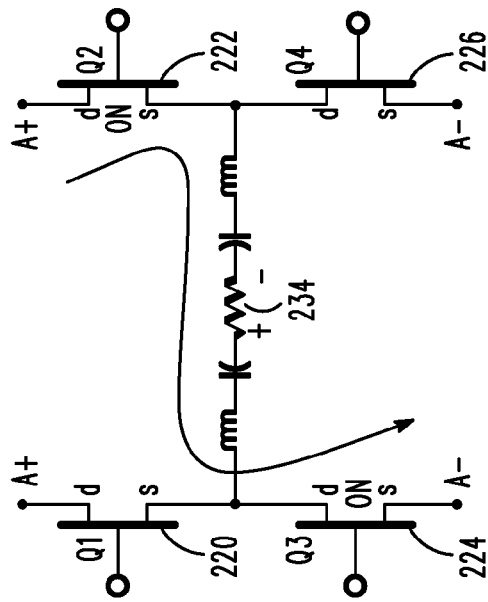
Figure 2B:
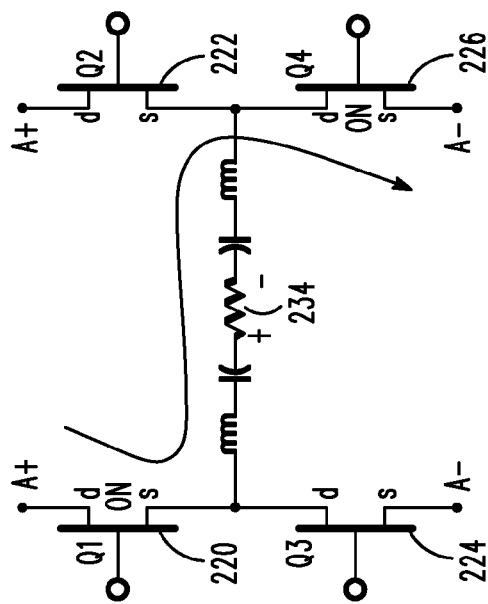

Referring now to FIG. 2A, an exemplary DDRF system 200 is shown. The DDRF system 200 includes an input for a modulated carrier 102. The DDRF system 200 further includes a Delta-Sigma Converter 202. The Delta-Sigma Converter 202 incorporates a quantizer 204 which produces a ternary output 206, e.g., three output states, plus-one (+1), zero (0) and minus-one (−1). The ternary output 206 drives a level select logic mapper 208. The level select logic mapper (hereinafter "mapper") 208 is a high speed device comprising digital logic and analog circuitry which interprets the output of the Delta-Sigma converter 202 into the appropriate gate drive signals for FETs of an H-Bridge PA 210, e.g. decoding of a multi-level serial signal into several single-level signals using a high speed ASIC or MMIC. The DDRF system 200 can have a frequency range of 20 MHz to 10 GHz at the output of the H-bridge PA 210.

The H-bridge PA 210 has four FETs, FET $Q_1$ 220, FET $Q_2$ 222, FET $Q_3$ 224, and FET $Q_4$ 226. The FET's $Q_1$ 220 and $Q_2$ 222 are each connected at the drain node to a positive "A" voltage 228. The source node 230 of FET $Q_1$ 220 is connected to the drain node of FET $Q_3$ 224. The source node of FET $Q_2$ 222 is connected to the drain node of FET $Q_4$ 226. A load 234 is connected on one side through a capacitance and an inductance to the source node 230 of FET $Q_1$ 220. The load 234 is connected on the other side through a capacitance and an inductance to the source node 232 of FET $Q_2$ 222. The source node of FET $Q_3$ 224 and FET $Q_4$ 226 are connected to a negative voltage "A−" 236 potential The mapper 208 is positioned between the multi-level delta-sigma converter 202 and the H-bridge PA 210. The mapper 208 is connected to the H-bridge PA 210 by four output connectors wherein, $V_1$ 212 of the mapper 208 is connected to $V_1$ 238 of FET $Q_1$ 220, $V_2$ 214 of the mapper 208 is connected to $V_2$ 240 of FET $Q_2$ 222, $V_3$ 216 of the mapper 208 is connected to $V_3$ 242 of FET $Q_3$ 224, and $V_4$ 218 of the mapper 208 is connected to $V_4$ 244 of FET $Q_4$ 226.

The function of the mapper 208 is to determine which combinations of FET devices 220, 222, 224, 226, of the H-Bridge PA 210 are driven to create each of the three states of the ternary output 206. Referring now to FIGS. 2B-2E, the plus-one (+1) state occurs when $Q_1$ 220 and $Q_4$ 226 are switched on, while $Q_2$ 222 and $Q_3$ 224 are off. Current flows through the load 234 from left to right for the plus-one (+1) state. Conversely, the minus-one (−1) state is created when $Q_2$ 222 and $Q_3$ 224 are switched on, while $Q_1$ 220 and $Q_4$ 226 are off. The minus-one (−1) state allows current to flow from right to left through the load 234. A third or "zero" (0) state is realized in either of two ways: either $Q_3$ 224 and $Q_4$ 226 are switched on while $Q_1$ 220 and $Q_2$ 222 are off, or $Q_1$ 220 and $Q_2$ 222 may be switched on, while $Q_3$ 224 and $Q_4$ 226 are off. The zero (0) states facilitate the generation of the time-varying envelope of the desired signal by providing a "resting state" during which neither on-channel nor off-channel power is produced. Because of this, the ratio of on-channel power to total power generated (i.e.: the algorithmic efficiency) is increased. Table 1.1 illustrates the three states and the alternate state that are mapped by the mapper 208.

TABLE 1.1

| State | $Q_1$ 220 | $Q_2$ 222 | $Q_3$ 224 | $Q_4$ 226 |
|---|---|---|---|---|
| +1 | ON | OFF | OFF | ON |
| −1 | OFF | ON | ON | OFF |
| 0 | OFF | OFF | ON | ON |
| 0 (alt) | ON | ON | OFF | OFF |

For three level or ternary signaling, typical parameter values used in equation 2 are: $PAR_{input}$=6.0 dB, $C_{BO}$=−0.1 dB, and $PAR_{output}$=4.4 dB, which result in $\eta_{ALG}$=−1.7 dB. Assuming the same 10 dB gain used in the binary signaling case, ternary signaling is seen to provide a much-improved H-bridge PA 210 stage gain of 8.3 dB (10−1.7=8.3 dB).

The reduction of $C_{BO}$ is a secondary benefit provided by the introduction of the zero state in ternary signaling. As evident in equation 2, the reduction of $C_{BO}$ acts together with the increase in $PAR_{output}$ to improve $|\eta_{ALG}|$. Note in FIG. 2 that $PAR_{output}$=4.4 dB applied to the input of the four H-bridge PA 210 results in the desired 6.0 dB PAR at the load 234, which is after the signal is efficiently amplified and passed through the output band-pass filter.

The zero (0) state cannot be created simply by removing the drive to the four FETs, $Q_1$ 220, $Q_2$ 222, $Q_3$ 224, and $Q_4$ 226 of the H-bridge PA 210. Energy stored in the reactive elements of the output band-pass filter must be allowed to "ring out" through the load 234 to avoid device destruction and/or distortion of the desired on-channel signal. To accomplish this, either $Q_3$ 224 and $Q_4$ 226 or $Q_1$ 220 and $Q_2$ 222 of H-bridge PA 210 must remain conducting ("ON") during the zero (0) state. Referring back to FIG. 1, diodes D1-D4 may be provided to enable a path back to the power supply for switching transients which would otherwise attempt to force current in the reverse direction through a device when the device is turned off. Since the forward drops across the diodes need to be at least as small as the saturation voltage (e.g.: Vds) of the devices to effectively remove all stored energy, and the diodes themselves introduce non-linearities into the operation of the H-bridge PA 126, the use of "active commutation" wherein either $Q_1$ 220 and $Q_2$ 222, or $Q_3$ 224 and $Q_4$ 226 are turned on is preferred.

Figure 3:
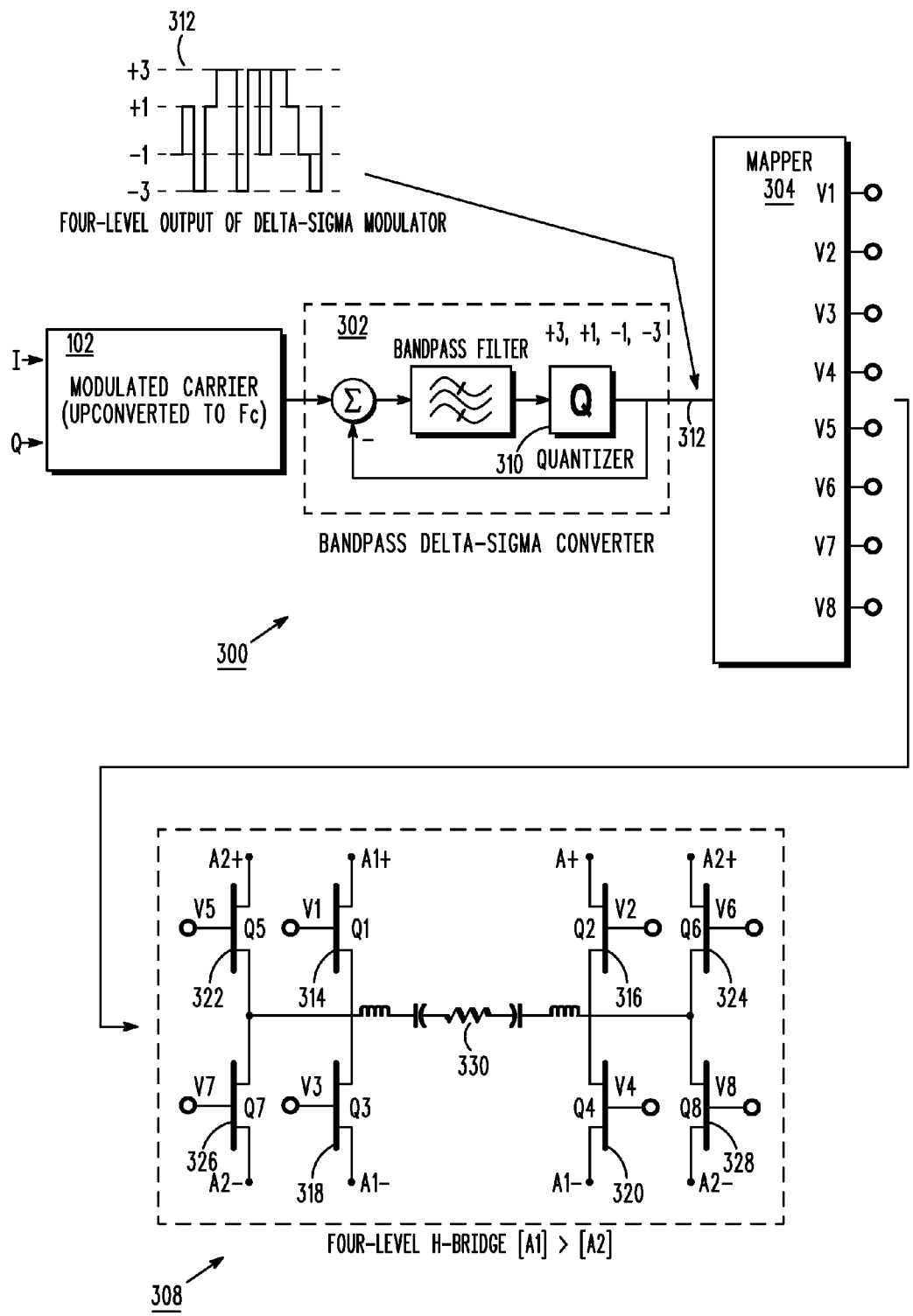
FIG. 3 is an exemplary digital to radio frequency transmitter system with a multi-level delta-sigma modulator, level select logic mapper and 4-level H-bridge.

Multiple-level signaling may be extended beyond ternary signaling to four levels. Referring now to FIG. 3, an exemplary DDRF system 300 with a four-level delta-sigma modulator 302, four state level select logic mapper 304 and 4-level H-bridge 308 is shown. The DDRF system 300 can have a frequency range of 20 MHz to 10 GHz at the output of the H-bridge PA 308. Here the delta-sigma converter 302 receives a modulated carrier signal 102 and uses a four level quantizer 310 which produces a four-level output 312 and drives a four-state mapper 304.

The four level H-bridge 308 requires eight devices, $Q_1$ 314, $Q_2$ 316, $Q_3$ 318, $Q_4$ 320, $Q_5$ 322, $Q_6$ 324, $Q_7$ 326, and $Q_8$ 328 to provide four non-zero states of the four level signal 312. The four-level H-bridge 308 is described in further detail herein below. The four state mapper 304 is connected from eight outputs $V_1$-$V_8$ to the inputs $V_1$ through $V_8$ of the devices $Q_1$ 314, $Q_2$ 316, $Q_3$ 318, $Q_4$ 320, $Q_5$ 322, $Q_6$ 324, $Q_7$ 326, and $Q_8$ 328 respectively.

The states, defined as plus-one-minus-one (±1) and plus-three-minus-three (±3), correspond to the voltage levels provided by two fixed power supplies ±A1 and ±A2. The voltage levels are exemplary and could essentially be any voltage level as long as supply voltage A1, which corresponds to the |±1| voltage level, is less than supply voltage A2, which corresponds to the |±3| voltage level. As illustrated by table 1.2, note that an explicit zero state is not required in four-level signaling since one of the two H-Bridges comprising PA 308, e.g., the inner configuration of FETs $Q_1$ 314, $Q_2$ 316, $Q_3$ 318, and $Q_4$ 320, or the outer configuration of FETs $Q_5$ 322, $Q_6$ 324, $Q_7$ 326, and $Q_8$ 328, is always conducting. A path is thereby provided to allow energy stored in the output filter to be delivered to the load 330.

TABLE 1.2

| State | $Q_1$ 314 | $Q_2$ 316 | $Q_3$ 318 | $Q_4$ 320 | $Q_5$ 322 | $Q_6$ 324 | $Q_7$ 326 | $Q_8$ 328 |
|---|---|---|---|---|---|---|---|---|
| +3 | ON | OFF | OFF | ON | OFF | OFF | OFF | OFF |
| +1 | OFF | OFF | OFF | OFF | ON | OFF | OFF | ON |
| −1 | OFF | OFF | OFF | OFF | OFF | ON | ON | OFF |
| −3 | OFF | ON | ON | OFF | OFF | OFF | OFF | OFF |

With regard to equation 2, typical CDMA values for four-level signaling are: $PAR_{input}$=6.0 dB, $C_{BO}$=−0.1 dB, and $PAR_{output}$=5.5 dB, which result in $\eta_{ALG}$=−0.6 dB. The resulting four level H-bridge PA 308 stage gain corresponding to the 10 dB reference value used previously is 9.4 dB (10−0.6=9.4 dB) for four-level signaling.

Figure 4A:
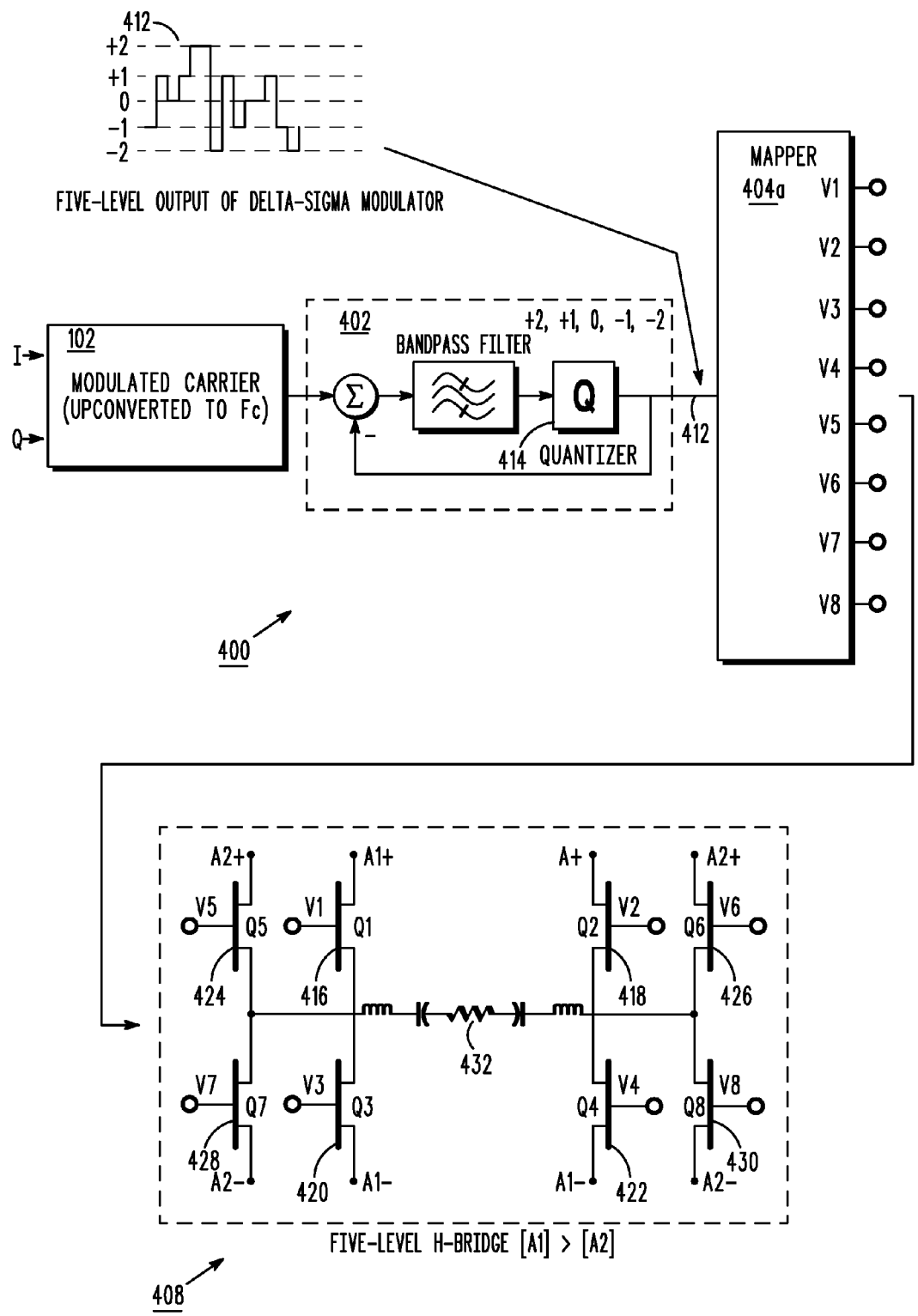
FIG. 4A is an exemplary digital to radio frequency transmitter system with a multi-level delta-sigma modulator, level select logic mapper and 5-level H-bridge.

Five level signaling may be realized through the addition of a zero (0) state 410 to four-level signaling 412. Referring now to FIG. 4A, an exemplary DDRF system 400 with a five-level delta-sigma modulator 402, a five state level select logic mapper 404a and 5-level H-bridge 408 is shown. Here the delta-sigma converter 402 receives a modulated carrier signal 102 and uses a five level quantizer 414 which produces a five-level output 412 and drives a five-state mapper 404a.

The five level H-bridge 408 requires eight devices, $Q_1$ 416, $Q_2$ 418, $Q_3$ 420, $Q_4$ 422, $Q_5$ 424, $Q_6$ 426, $Q_7$ 428, and $Q_8$ 430 to provide the five output states corresponding to the five level signal 412. The five-level H-bridge 408 can be the same as the four level H-bridge 308, which is described in further detail herein below. The five state mapper 404a is connected from eight outputs $V_1$-$V_8$ to the inputs $V_1$ through $V_8$ of the devices $Q_1$ 416, $Q_2$ 418, $Q_3$ 420, $Q_4$ 422, $Q_5$ 424, $Q_6$ 426, $Q_7$ 428, and $Q_8$ 430 respectively.

The states, defined as plus-one-minus-one (±1) and plus-two-minus-two (±2), correspond to voltage levels provided by two fixed power supplies ±A1 and ±A2. The voltage levels are exemplary and could essentially be any voltage level as long as the supply voltage A1, which corresponds to the |±1| voltage level, is less than the supply voltage A2, which corresponds to the |±2| voltage level. As illustrated by table 1.3, either the lower pair of devices, $Q_7$ 428 and $Q_8$ 430, or the upper pair of devices, $Q_5$ 424 and $Q_6$ 426, associated with the higher voltage power supply is turned on during the zero state to provide the path by which energy stored in the output filter is delivered to the load 432. Alternatively, $Q_3$ 420 and $Q_4$ 422, or $Q_1$ 416 and $Q_2$ 418, associated with the lower supply, may be turned on during the zero state if desired.

TABLE 1.3

| State | $Q_1$ 416 | $Q_2$ 418 | $Q_3$ 420 | $Q_4$ 422 | $Q_5$ 424 | $Q_6$ 426 | $Q_7$ 428 | $Q_8$ 430 |
|---|---|---|---|---|---|---|---|---|
| +2 | ON  | OFF | OFF | ON  | OFF | OFF | OFF | OFF |
| +1 | OFF | OFF | OFF | OFF | ON  | OFF | OFF | ON  |
| 0  | OFF | OFF | OFF | OFF | OFF | OFF | ON  | ON  |
| −1 | OFF | OFF | OFF | OFF | OFF | ON  | ON  | OFF |
| −2 | OFF | ON  | ON  | OFF | OFF | OFF | OFF | OFF |

For equation 2, typical CDMA values for five-level signaling are: $PAR_{input}=6.0$ dB, $C_{BO}=-0.05$ dB, and $PAR_{output}=5.8$ dB, resulting in $\eta_{ALG}=-0.25$ dB. For the reference gain of 10 dB used previously, four level signaling results in a PA stage gain of 9.75 dB.

Figure 5:
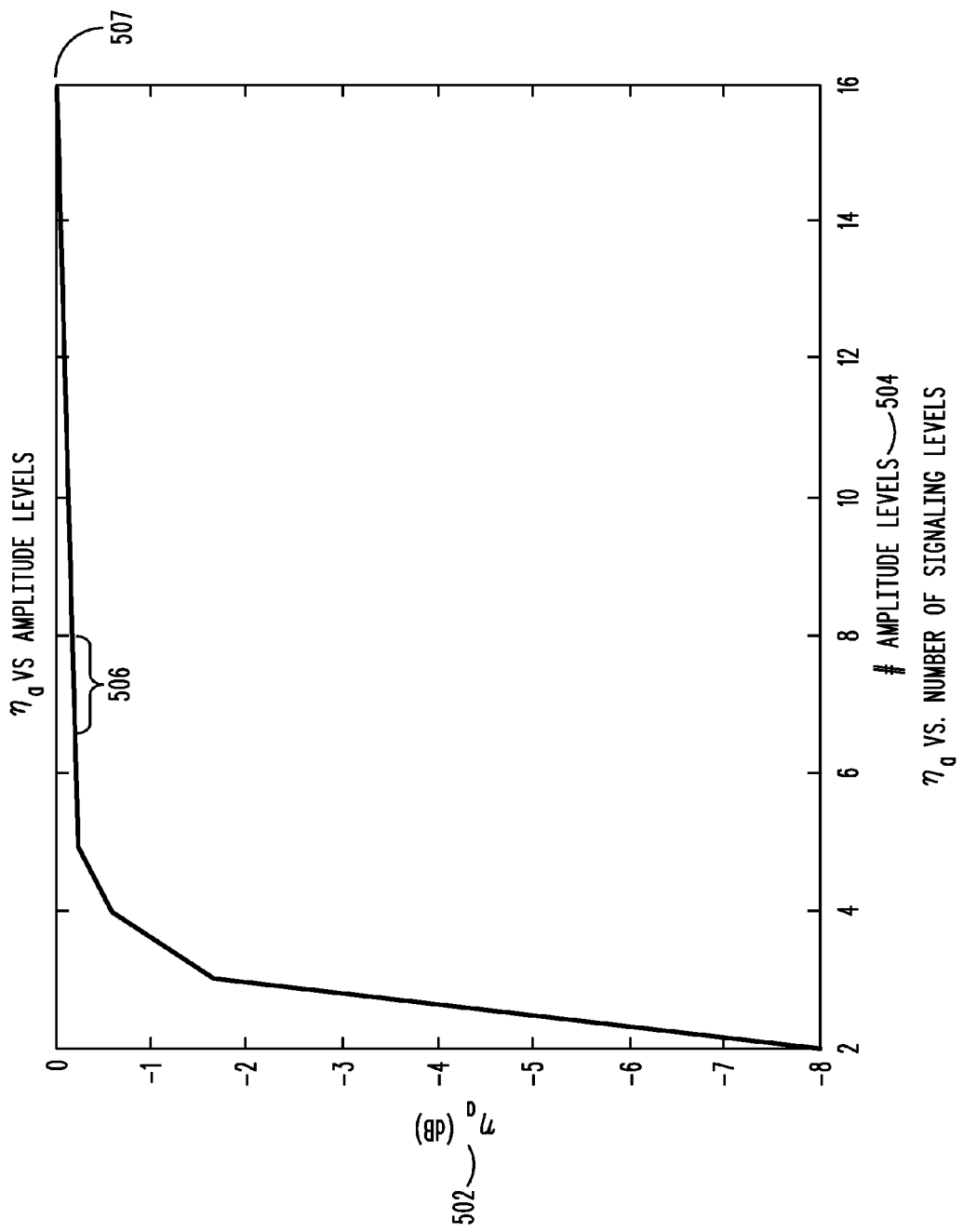
FIG. 5 is a representation of the increase in algorithmic efficiency achieved by various embodiments of the present invention.

Improved algorithmic efficiency and stage gain occur with increasingly complex (more levels) signaling. FIG. 5 illustrates the results of multiple simulations for which an algorithmic efficiency 502 vs. number of signaling levels 504 plot was obtained. While diminishing returns 506 appear to be reached after seven to eight (7-8) signaling levels 506, practical systems are likely to be limited to three to five (3-5) levels because of the increased hardware complexity associated with additional levels. Stated another way, the improvement of $\eta_{ALG}$ is very large when comparing an exemplary 2-level H-Bridge configuration to a 5-level H-Bridge configuration. But, as the number of levels increases above five (5) levels, the improvement per additional level moves towards an asymptote at 0 dB 507. Note however, that additional signaling levels may be introduced simply by selecting the appropriate pairs of H-Bridge switches within topologies such as FIG. 3. For example, an intermediate level may be created by closing switches $Q_6$ 324 and $Q_3$ 318 or $Q_5$ 322 and $Q_4$ 320.

In practice, the actual $\eta_{ALG}$ achieved for a given number of signaling levels will be somewhat degraded from the values shown in FIG. 5. This is due to the non-ideal behavior of the band-pass filter placed at the PA output, and sinc-roll-off associated with the sample-and-hold operation that must be performed on the waveform driving the PA. However, it should be noted that while previous artisans have sought to make the analog systems more like digital systems, the $\eta_{ALG}$ achieved for a given number of signaling levels illustrates that the converse is true such that a digital system should be made to look like an analog system instead.

The embodiments have been discussed in the context of improved power added efficiency (PAE); however multiple level signaling is seen to produce an improvement in drain efficiency as well. If the switching devices used in the H-Bridge were ideal, all on-channel power would pass through the output filter to the load, while off-channel power would be completely rejected by the filter. None of the off-channel signal components would contribute to the DC input power consumed by the H-Bridge. The actual switching FETs that may be used in the H-Bridge have a small but finite capacitance between the drain and source. This capacitance creates a "leakage path" by which off-channel signal components are shunted around the output filter, resulting in increased DC input power and lower drain efficiency. The improved algorithmic efficiency associated with multiple level signaling concentrates more energy in the on-channel spectrum, reducing the amount of off-channel signal available for the leakage path. As an example, for an H-bridge constructed from practical device technologies and in accordance with the embodiments, an improvement in drain efficiency of about 10% can be realized with three-level signaling over that of two-level signaling. Further efficiency improvements may be achieved through the use of a switching device technology that minimizes the drain-source capacitance. Semiconductor technologies having a high power density, such as Gallium Nitride may be used.

Figure 4B:
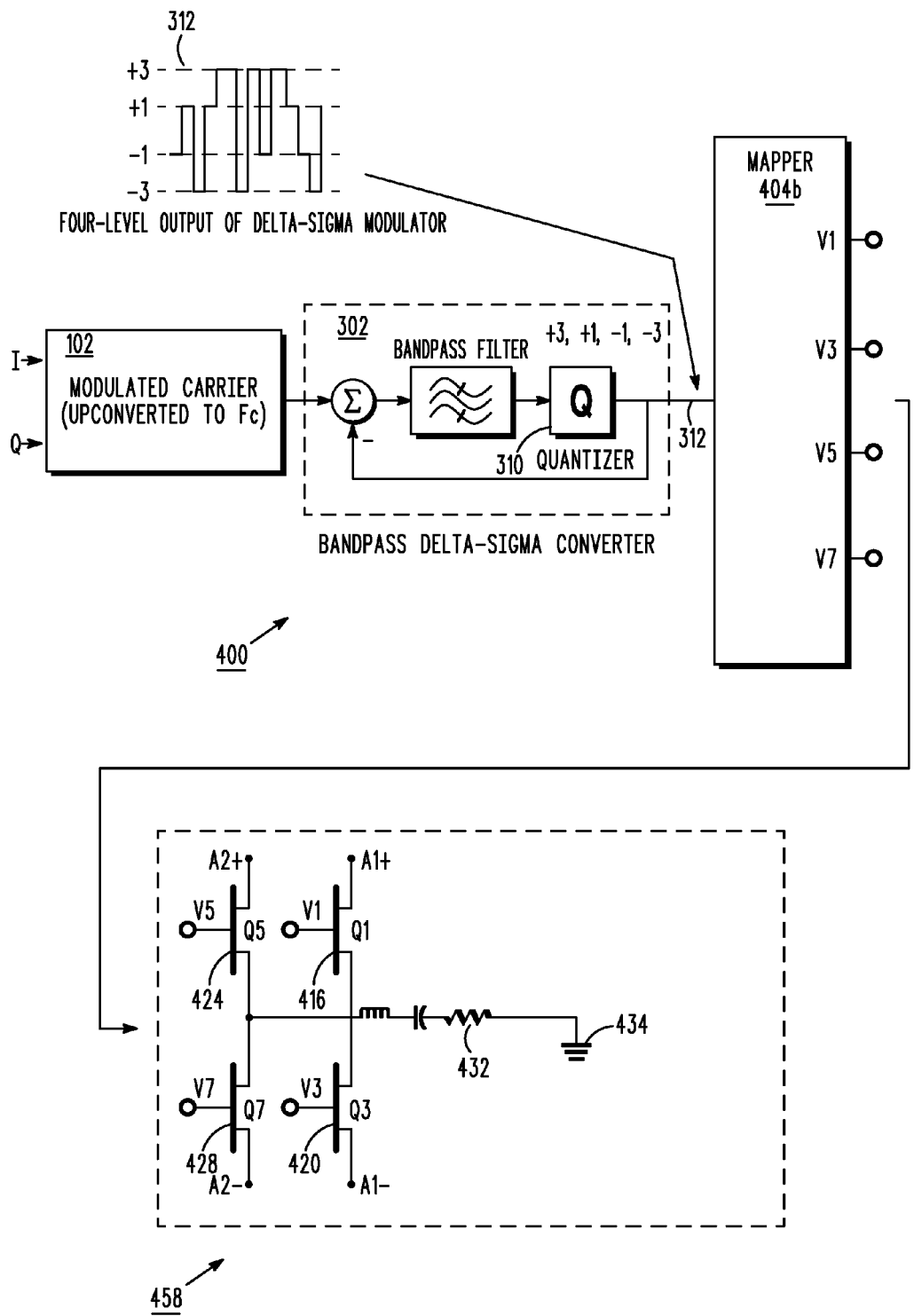
FIGS. 4B and 4C are an exemplary digital to radio frequency transmitter systems utilizing half-bridge topology.

An exemplary symmetric H-Bridge topology, commonly known as a "full-bridge," has been illustrated. Those skilled in the art will recognize that a half-bridge topology as shown in FIG. 4B may be used as well. The exemplary half bridge topology may be implemented by using only the left side, $Q_1$ 416, $Q_3$ 420, $Q_5$ 424, and $Q_7$ 428, of the H-Bridge 458. The right side of the load 432 is connected to ground at node 434. The mapper 404b provides only 4 outputs: $V_1, V_3, V_5$ and $V_7$. This latter topology uses four FETs and is capable of four-level operation.

Figure 4C:
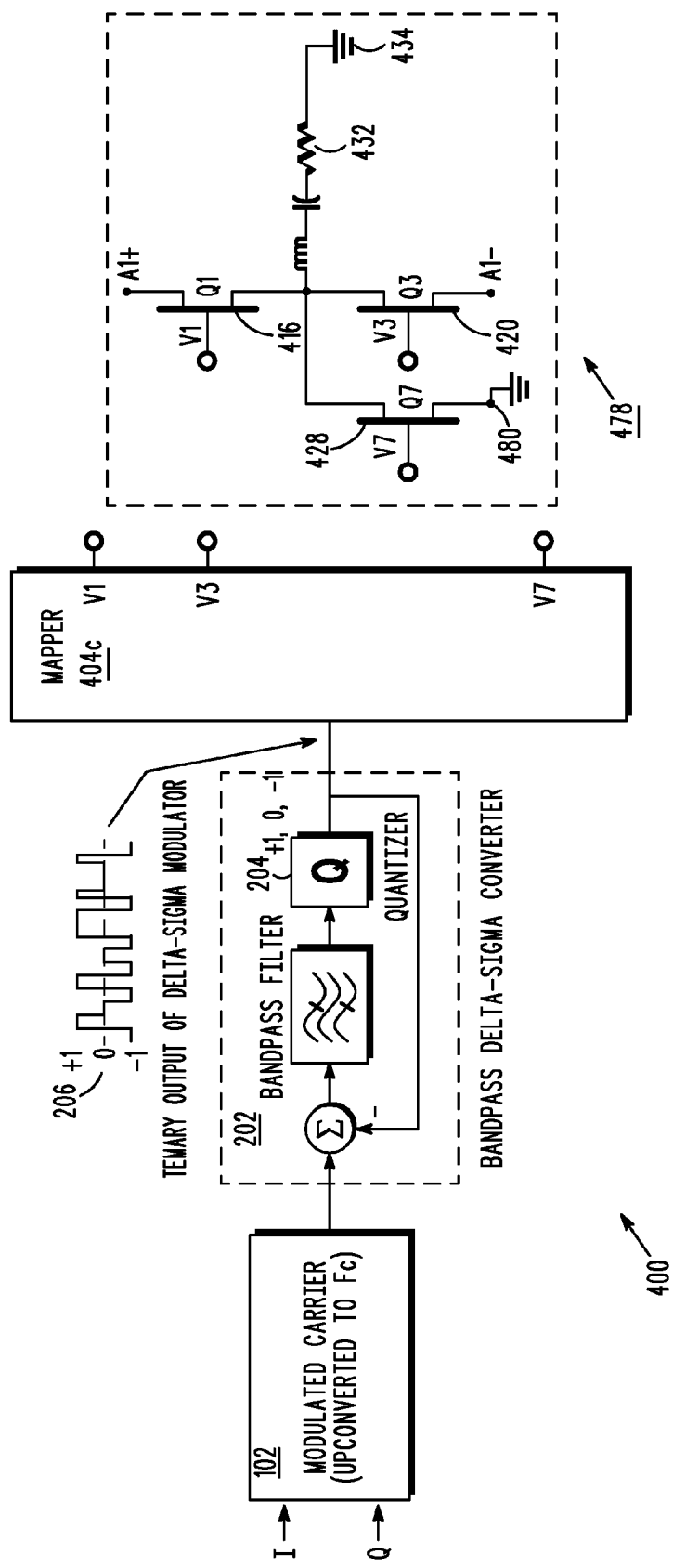

Referring now to FIG. 4C, another embodiment of a half-bridge implementation is illustrated. The half-bridge 478 utilizes three (3) devices instead of the four shown in the half-bridge 458 of FIG. 4B. The device $Q_5$ 424 is eliminated. $Q_7$ 428 is connected at one 480 to a ground. The right side of the load 432 connected to ground at node 434. The mapper 404c provides only 3 outputs: $V_1, V_3$, and $V_7$. Additionally, the Delta-Sigma Converter 202 with quantizer 204 may be used. This latter topology uses three FETs and is capable of three-level operation. The disclosure of these alternate power amplifier topologies in no way detracts from or supersedes the pervading principles described herein.

The Multi-Level H-Bridge

Figure 6:
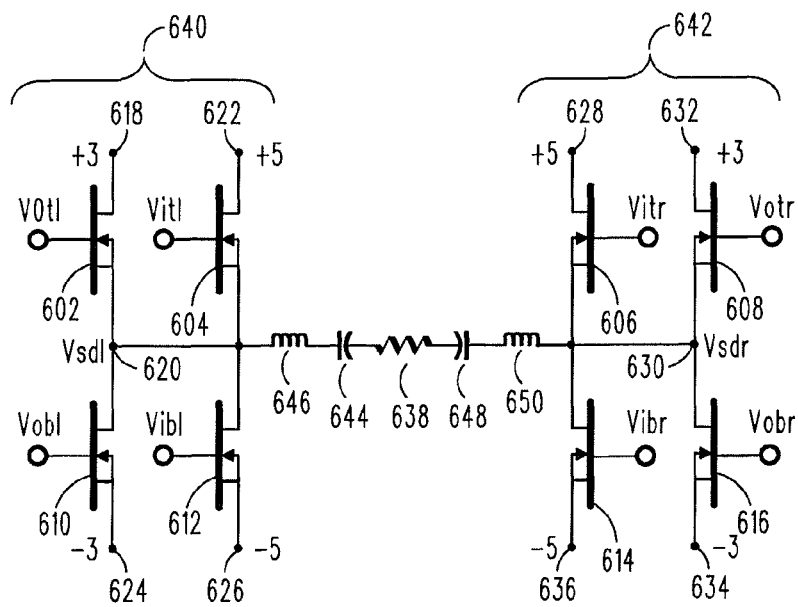
FIG. 6. is an exemplary configuration for a multi-level H-bridge Power Amplifier.

Referring now to FIG. 6, an exemplary configuration for a multi-level H-bridge Power Amplifier is shown. The multiple-level H-bridge Power Amplifier (hereinafter "H-bridge") 600 is comprised of eight bipolar or FET devices, an outside top left $FET_{OTL}$ 602, an inside top left $FET_{ITL}$ 604, an inside top right $FET_{ITR}$ 606, and outside top right $FET_{OTR}$ 608, an outside bottom left $FET_{OBL}$ 610, an inside bottom left $FET_{IBL}$ 612, an inside bottom right $FET_{IBR}$ 614, and an outside bottom right $FET_{OBR}$ 616. These devices can be Gallium Nitride FETs, Gallium Arsenide, or other transistors of comparable or greater switching frequency capability. A positive potential of +3 volts 618 is connected to the drain node of $FET_{OTL}$ 602. The source node of $FET_{OTL}$ 602 is connected to node $V_{sdl}$ 620. A positive potential of +5 volts 622 is connected to the drain node of $FET_{ITL}$ 604. The source node of $FET_{ITL}$ 604 is connected to node $V_{sdl}$ 620. The drain node of $FET_{OBL}$ 610 is connected to node $V_{sdl}$ 620 as well as the drain node of $FET_{IBL}$ 612. The source node of $FET_{OBL}$ 610 is connected to the negative potential −3 Volts 624 while the source node of $FET_{IBL}$ 612 is connected to the negative potential −5 Volts 626. A positive potential of +5 volts 628 is connected to the drain node of $FET_{ITR}$ 606. The source node of $FET_{ITR}$ 606 is connected to node $V_{sdr}$ 630. A positive potential of +3 volts 632 is connected to the drain node of $FET_{OTR}$ 608. The source node of $FET_{OTR}$ 608 is connected to node $V_{sdr}$ 630. The drain node of $FET_{OBR}$ 616 is connected to node $V_{sdr}$ 630 as well as the drain node of $FET_{IBR}$ 614. The source node of $FET_{OBR}$ 616 is connected to the negative potential −3 Volts 634 while the source node of $FET_{IBR}$ 614 is connected to the negative potential −5 Volts 636. A load 638 is connected between the left configuration 642 the right configuration 640 of the multi-level H-bridge 600. One end of the load 638 is connected through a capacitor 644 and an inductor 646 to $V_{sdl}$ 620. The other end of the load 638 is connected through capacitor 648 and inductor 650 to $V_{sdr}$ 630. Artisans of ordinary skill will appreciate that the use of the three (3) volt and five (5) volt supplies is for illustrative purposes and in no way limits the scope of the invention.

Figure 7:
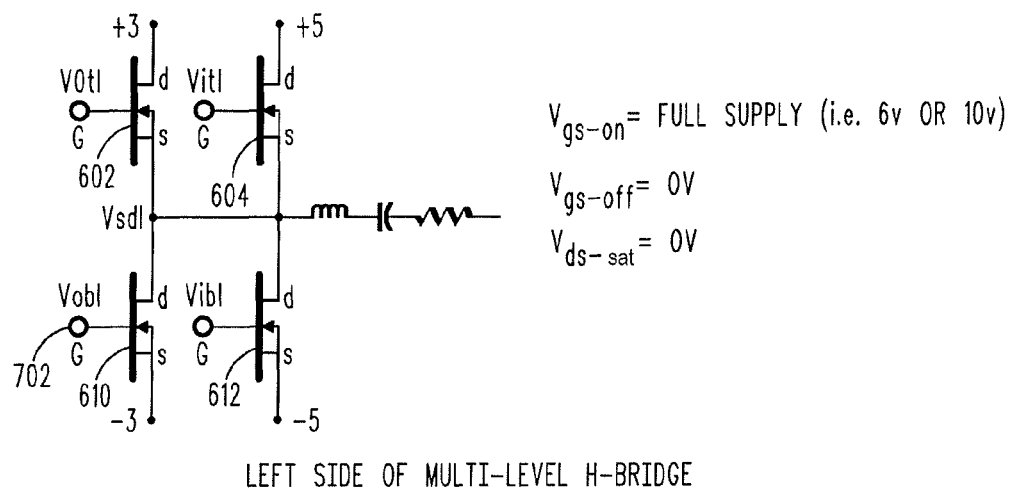
FIGS. 7, 8A, and 8B are exemplary diagrams of a configuration of the multi-level H-bridge.

Referring now to FIG. 7, an exemplary left side configuration 640 of the multi-level H-bridge 600 is shown. To turn on any of the devices will require a gate-source voltage of six (6) volts for $FET_{OTL}$ 602 and $FET_{OBL}$ 610 and a gate-source voltage of ten (10) volts for $FET_{ITL}$ 604, and $FET_{IBL}$ 612. The left configuration 640 will never have more than one device turned on at one time. Artisans of ordinary skill will appreciate that the left configuration 640 is illustrated for exemplary purposes. The right configuration 642 will be configured in a mirrored manner as shown in FIG. 6. Therefore, only one device on each side of the multi-level H-bridge 600 will be turned on at one time (e.g. for a total of two devices over the multi-level H-bridge 600). To turn off any of the devices, the gate-source voltage will equal zero (0) volts. As an example, to turn off $FET_{OBL}$ 610, $V_{OBL}$ 702 must equal negative three (−3) volts to make the gate-source voltage $V_{gs}$=0 volts. Furthermore, the drain-source voltage $V_{ds}$ can be assumed to be 0 volts at saturation for any of these devices; this assumes that the devices operate as perfect switches. Depending upon the particular application and semiconductor device technology employed, the gate-source voltages required to turn a particular device on or off may differ from the values illustrated. Further, the full gate-source potentials (six volts for $FET_{OTL}$ 602 and $FET_{OBL}$ 610 and ten volts for $FET_{ITL}$ 604, and $FET_{IBL}$ 612) may be larger than the minimum potential necessary to rapidly turn-on a particular FET. This is dependant upon which FET had been turned on immediately prior in time. Since the drive power required by a FET increases with the applied gate-source voltage swing, it may be advantageous to scale the gate-source potentials in response to the specific time sequencing of the various FETs shown in FIG. 7. The scaling of the gate-source potentials may be done under circumstances where drive power consumption must be limited. For ease of illustration however, a voltage equal to the full supply potential (six volts or ten volts) will be assumed as the gate-source voltage necessary to turn a particular FET on, as stated above.

Figure 8A:
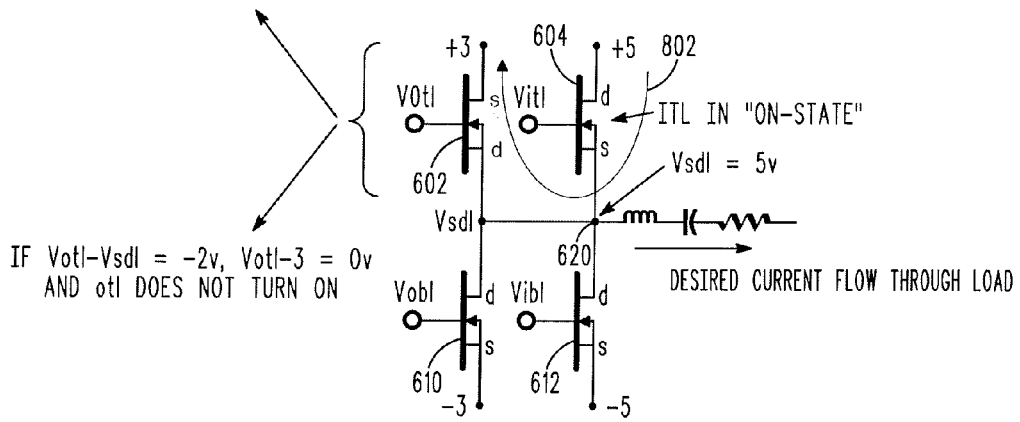

Referring now to FIG. 8A, an exemplary left side configuration 640 of the multi-level H-bridge 600 is shown. A ten (10) volt potential is applied to $V_{ITL}$ of $FET_{ITL}$ 604 such that the Gate-Source Voltage, $V_{gs}$=$V_{ITL}$−$V_{sdl}$=10 volts. Therefore, $FET_{ITL}$ 604 is turned to the "ON" state. $FET_{ITL}$ 604 saturates when it is in the "ON" state. The saturation of $FET_{ITL}$ 604 causes the voltage drop from its drain to the source to become zero (0) volts. $V_{sdl}$ 620 thus becomes five (5) volts. Recall that $FET_{OTL}$ 602 is off for $V_{OTL}$−$V_{sdl}$=0 volts. Since $V_{sdl}$ 620 is five (5) volts and $V_{OTL}$−$V_{sdl}$=0 volts, $V_{OTL}$ now becomes five (5) volts. Note that $V_{sdl}$ 620 equaling five (5) volts causes a drain-source reversal at $FET_{OTL}$ 602, due to the fact that FETs are symmetrical devices. The voltage $V_{OTL}$−3 represents a positive gate-source voltage $V_{gs}$ for the reversed $FET_{OTL}$ 602 with respect to the +3 volt supply. As a result, $FET_{OTL}$ 602 conducts current 802 into the +3 volt supply. However, if $V_{OTL}$−$V_{sdl}$=−2 volts, then the gate-source $V_{gs}$ ($V_{OTL}$−3) becomes zero (0) volts and $FET_{OTL}$ 602 remains "OFF". This situation only occurs when the device next to $FET_{OTL}$ 602 is turned on, e.g., when $FET_{ITL}$ 604 is turned "ON."

Figure 8B:
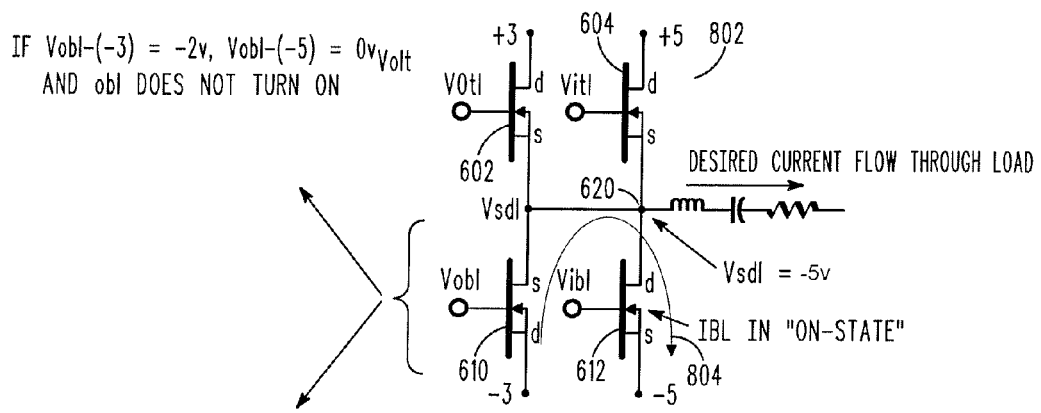
Figure 9A:
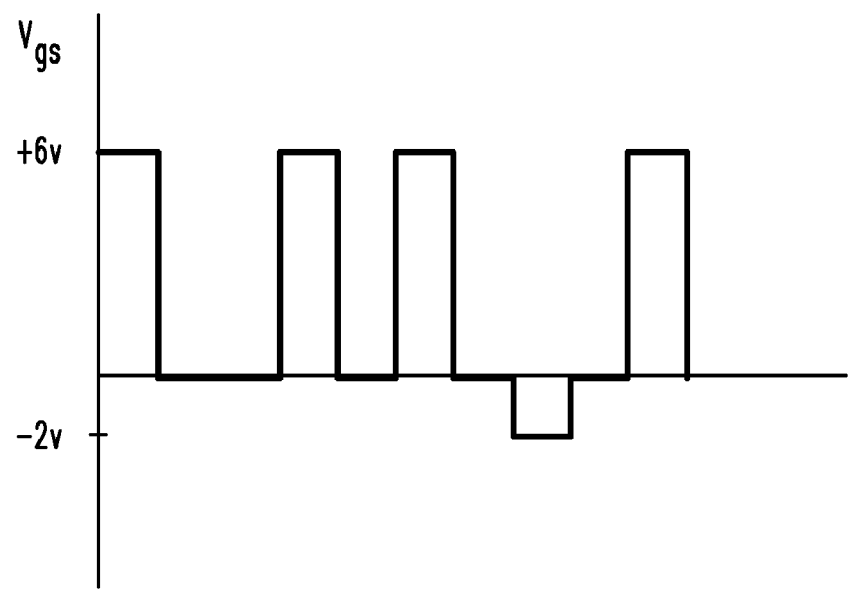
FIGS. 9A and 9B are exemplary graphs of the Gate-Source drive voltage necessary to prevent drain-source inversion.
Figure 9B:
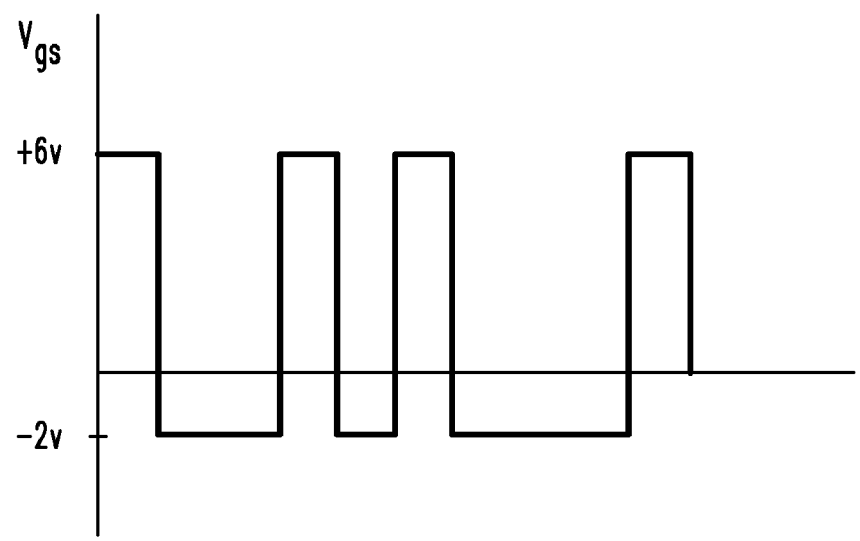

Referring now to FIG. 8B, an exemplary left configuration 640 of the multi-level H-bridge 600 is shown. $FET_{IBL}$ 612 saturates when it is in the "ON" state The saturation of $FET_{IBL}$ 612 causes the voltage drop from the drain to the source to become zero (0) volts. As a result, $V_{sdl}$ 620 becomes negative five (−5) volts. Recalling that $FET_{OBL}$ 610 is "OFF" when its $V_{gs}$=0 volts, thus $V_{OBL}$−(−3)=0 volts, and $V_{OBL}$=−3 volts. Again, a drain source reversal occurs due to the fact that the FET is a symmetrical device. At $FET_{OBL}$ 610, $V_{OBL}$−$V_{sdl}$ becomes a positive $V_{gs}$. As a result, $FET_{OBL}$ 610 conducts current 804 from the negative three (−3) volt supply into the negative five (−5) volt supply. However, if $V_{OBL}$ is set to negative five (−5) volts, then $V_{OBL}$−(−3)=−2 volts. Thus, $V_{OBL}$−$V_{sdl}$ becomes zero (0) volts and $FET_{OBL}$ 610 does not turn on. To ensure the outer FET devices remain in the off state, a gate source voltage of −2 volts must be applied whenever the nearby inner device is turned on. Using the previous example, FIG. 9A depicts a method wherein a voltage of −2 volts is applied across $V_{gs}$ of $FET_{OBL}$ 610 only when the nearby device, $FET_{IBL}$ 612, is turned on. Because the input power required to drive the switching device is the product of the gate current and gate-source voltage swing, the part-time usage of −2 volts for $V_{gs}$, reduces the average power needed to drive the switch. The same approach may be applied to the upper FET switches, $FET_{OTL}$ 602 and $FET_{ITL}$ 604. Alternatively, the $V_{gs}$ waveform shown in FIG. 9B may be used, however, the larger voltage swing increases the required drive power, effectively reducing the gain of the H bridge PA 600.

Figure 10:
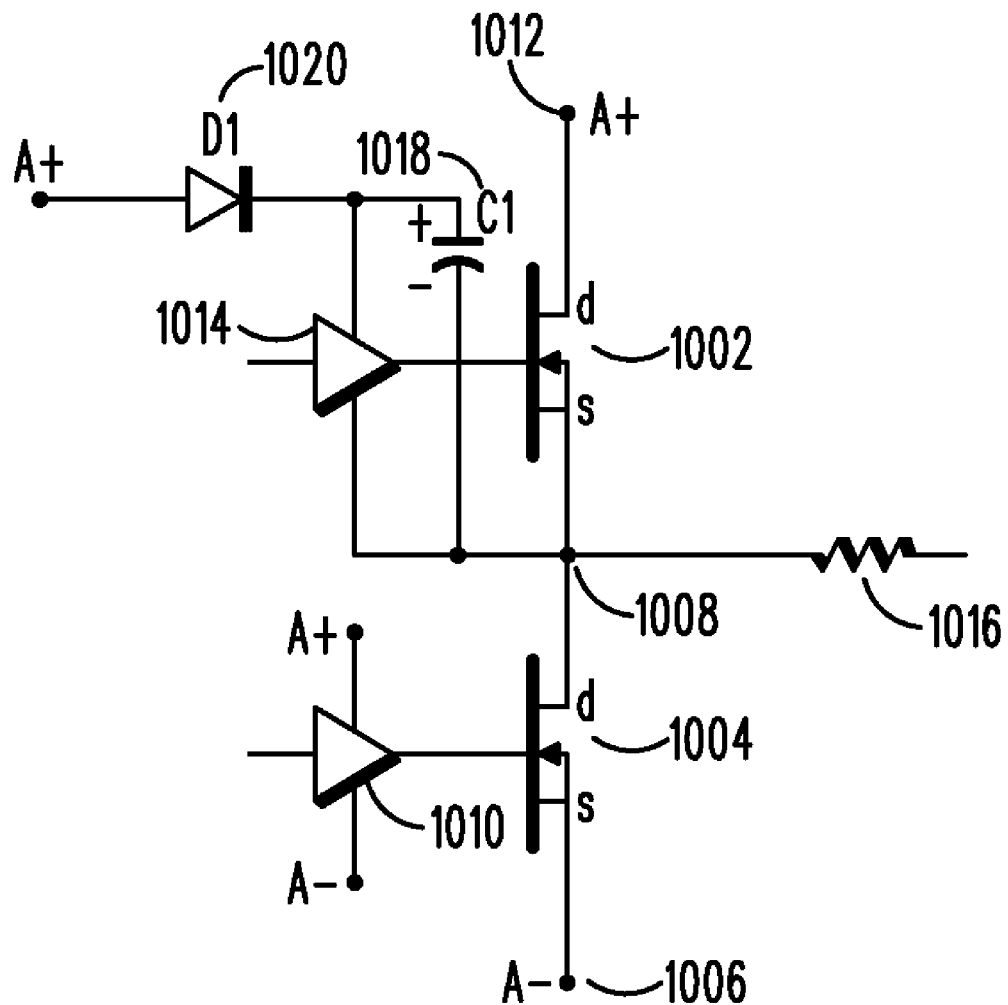
FIG. 10 is a prior art diagram of a configuration of the H-bridge Power Amplifier with a Bootstrap Capacitor incorporated.

Referring now to FIG. 10, a prior art diagram of a configuration of the H-bridge Power Amplifier with a Bootstrap Capacitor incorporated is shown. An upper FET device 1002 and a lower FET device 1004 of one side of an H-bridge are shown. The lower FET device 1004 is connected on the source node to a voltage source A− 1006. The lower FET device 1004 is further connected to at the drain node to a central node 1008. Additionally, the lower FET has the gate node connected to a lower driver 1010. The upper FET 1002 is connected at the drain node to a voltage source A+ 1012, the source node connected to the central node 1008, and the gate node connected to an upper driver 1014. A load 1016 is connected at one end to the central node 1008. A capacitor C1 1018 is connected at the bottom node to the central node 1008 and at the top node to a diode D1 1020. The diode D1 1020 is further connected to the voltage source A+ 1012. The upper driver 1014 is additionally connected at one input to the top node of the capacitor C1 1018 and at another input to the central node 1008. (These "inputs" of driver 1014 are its A+ and A− terminals.)

When the lower FET device 1004 connected to voltage source A− 1006 is turned on, the capacitor C1 1018 charges. The capacitor C1 1018 builds a charge from A+ 1012 through the diode D1 1020. The charge is used to operate the upper driver 1014 which, in turn, is used to drive the upper device 1002. The circuit configuration accommodates the time varying voltage present at central node 1008, which is connected to the load 1016 and is varying up and down in voltage potential from A+ to A− as the upper device 1002 and lower device 1004 are turned on and off. The lower device 1004 is referenced to A− 1006 while the upper device 1002 is referenced to the central node 1008 which, as previously stated, will vary up and down. The upper driver 1014 needs to be able to follow the reference on the source of the upper device 1002 and be able to control the voltage on the gate of the upper device 1002 regardless of the voltage present on the central node 1008. Because the bottom of the capacitor C1 1018 and the bottom of the upper driver 1014 are connected to the central node 1008, the upper driver 1014 can track the voltage on the central node 1008 as the central node's voltage varies. Thus, the upper driver 1014 can add the appropriate potential to the time-varying voltage present at the central node 1008.

Figure 11:
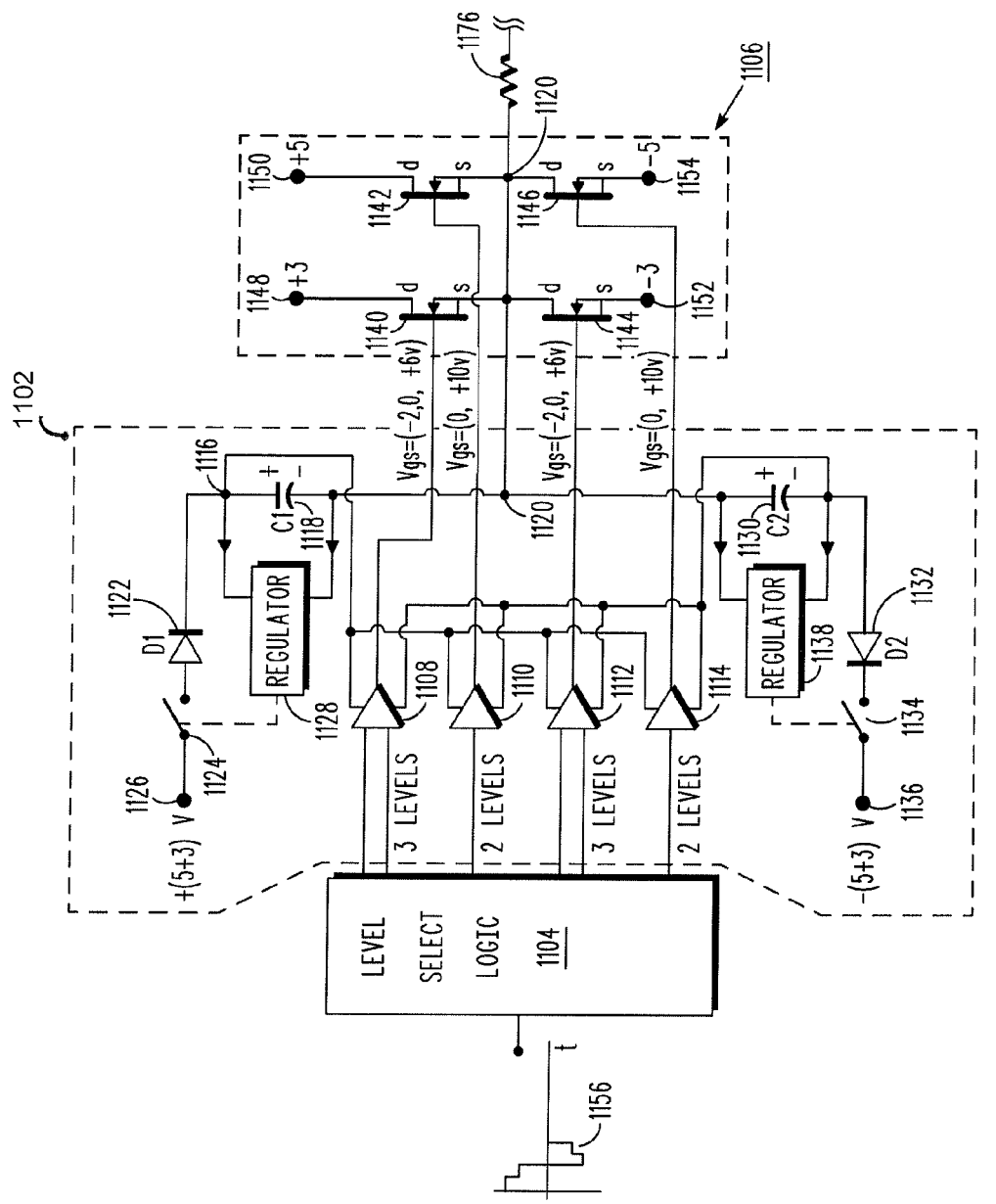
FIG. 11 is an exemplary configuration of a positive-negative floating drive source connected to the multi-level H-bridge.

Referring now to FIG. 11, an exemplary configuration of a positive-negative drive source connected to the multi-level H-bridge is shown. A floating drive source 1102 is connected between the level select logic mapper 1104 and a multi-level H-bridge 1106. For illustration purposes, only one half of the multi-level H-bridge 1106 is shown. However, one of ordinary skill in the art would appreciate that an identical configuration exists for the other half of the multi-level H-bridge 1106. The mapper 1104 can be like the previous mapper's 208, 304, 404 described hereinabove. The mapper 1104 can be one mapper 1104 that drives both halves of the multi-level H-bridge 1106, or it can be two mappers 1104 wherein one mapper 1104 drives one half of the multi-level H-bridge 1106 and the other mapper 1104 drives the other half of the multi-level H-bridge 11106.

The floating drive source 1102 is comprised of a top 3-level driver 1108, a top 2-level driver 1110, a bottom 3-level driver 1112, and a bottom 2-level driver 1114. Each of the drivers 1108, 1110, 1112, 1114 are connected to the level select logic mapper 1104. Additionally, each of the drivers 1108, 1110, 1112, 1114 are connected to a top node 1116 of a capacitor C1 1118. Capacitor C1 1118 is connected to a central node 1120. A diode D1 1122 is connected at its cathode to the top node 1116 of capacitor C1 1118. The diode D1 1122 is connected at its anode to a top switch 1124. The top switch 1124 is further connected to a top voltage source 1126 of +8 volts. A top regulator 1128 is connected across capacitor C1 1118 by connecting to the top node 1116 of capacitor C1 1118 and to the central node 1120. The top regulator 1128 controls the top switch 1124 to charge the capacitor C1 1118 capacitance to a minimum supply needed for the drivers 1108, 1110, 1112, 1114. The drivers 1108, 1110, 1112, 1114 are additionally connected to a bottom node 1128 of a second capacitor C2 1130. The capacitor C2 1130 is also connected to the central node 1120. A second diode D2 1132 is connected its anode to the bottom node 1128 of the capacitor C2 1130. The diode D2 1132 is connected at its cathode to a bottom switch 1134. The bottom switch 1134 is additionally connected to a bottom voltage source 1136 of negative-eight (−8) volts. A bottom regulator 1138 is connected across the capacitor C2 1130 by connecting to the bottom node 1128 of the capacitor C2 1130 and to the central node 1120. The bottom regulator 1138 controls the bottom switch 1134 to charge the capacitor C2 1130 capacitance to a minimum negative supply needed for the drivers 1108, 1110, 1112, 1114.

The multi-level H-bridge 1106 can be like the previous multi-level H-bridge's 308, 408, described hereinabove. A left configuration of the multi-level H-bridge 1106 is shown. The multi-level H-bridge 1106 comprises an outer top device 1140, an inner top device 1142, an outer bottom device 1144 and an inner bottom device 1146. The outer top device 1140 is connected at a drain node to a +3 voltage source 1148. The outer top device 1140 is additionally connected at a source node to the central node 1120. The inner top device 1142 is connected at a drain node to a +5 voltage source 1150 and connected at a source node to the central node 1120. The outer bottom device 1144 is connected at a source node to a negative-three (−3) voltage source and connected at a drain node to the central node 1120. The inner bottom device 1146 is connected at a source node to a negative-five (−5) voltage source 1154 and connected at a drain node to the central node 1120.

A load 1176 is also connected at one end to the central node 1120. The top 3-level driver 1108 is connected to the gate node of the outer top device 1140. The top 2-level driver 1110 is connected to the gate node of the inner top device 1142. The bottom 3-level driver 1112 is connected to the gate node of the outer bottom device 1144 and the bottom 2-level driver 1114 is connected to the gate node of the inner bottom device 1146.

The floating drive source 1102 is setup such that when either the outer bottom device 1144 or the inner bottom device 1146 is turned on, the capacitor C1 1118 charges through the diode D1 1122. Additionally, if either the outer top device 1140 or the inner top device 1142 is turned on, the capacitor C2 1130 charges through the diode D2 1132. The floating drivers 1108, 1110, 1112, 1114 are connected on a top supply side to capacitor C1 1118 and on a bottom supply side to the capacitor C2 1130. Therefore, each of the floating drivers 1108, 1110, 1112, 1114 is provided a power supply potential referenced to central node 1120. As such, the 3-level top driver 1108, and the 3-level bottom driver 1112 are each adapted to create a $V_{gs}$ voltage of positive 6 volts (+6V), 0 volts, and negative 2 volts (−2V) for the outer top device 1140 and the outer bottom device 1144. The 2-level top driver 1110 and the 2-level bottom driver 1114 each can create a $V_{gs}$ voltage of either positive 10 volts (+10V) or 0 volts for the inner top device 1142 and the inner bottom device 1146.

The mapper 1104, which may be an ASIC in some embodiments, is adapted to receive the multi-level signal, e.g., four or five level signal 1156 and generate an appropriate drive signal for each of the floating drivers 1108, 1110, 1112, 1114. The mapper 1104 can set the 3-level top driver 1108 and the 3 level bottom driver 1112 to one of three states to generate an appropriate $V_{gs}$ of negative-two (−2) volts, zero (0) volts or positive-six (+6) volts, based on the input signal. The mapper 1104 additionally sets the 2-level top driver 1110 and the 2-level bottom driver 1114 to one of two states to generate an appropriate $V_{gs}$ of zero (0) volts or positive-ten (+10) volts based on the input signal 1156.

Figure 12:
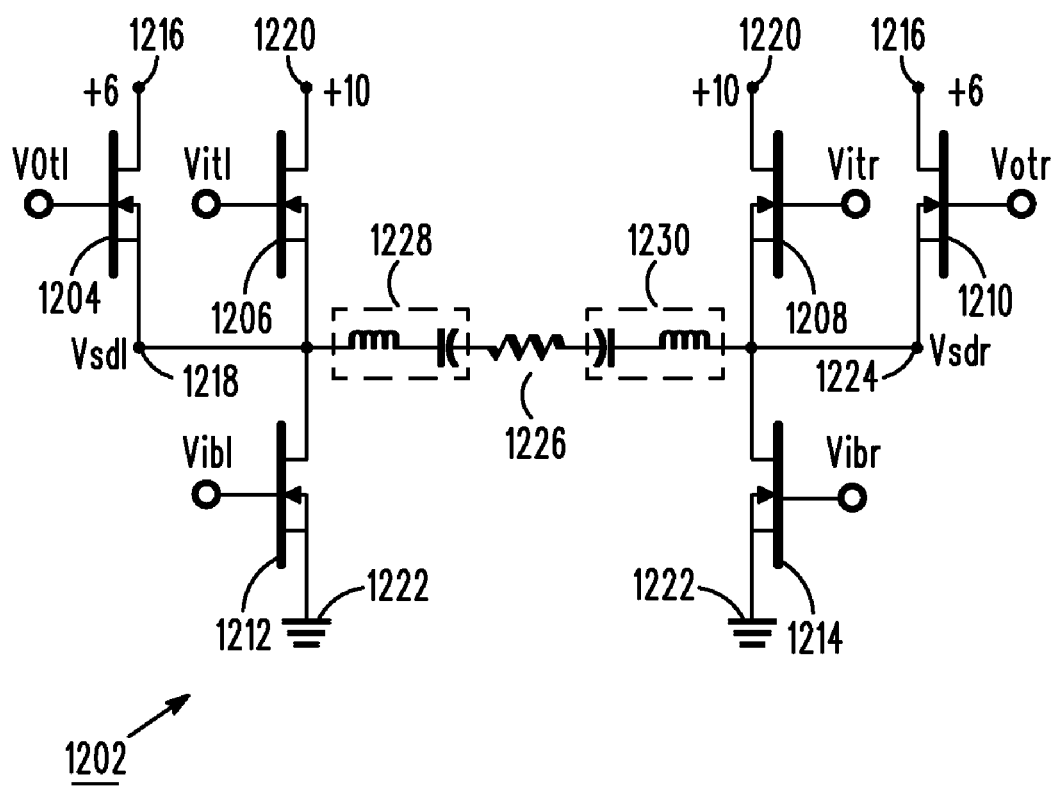
FIG. 12 is an exemplary configuration of a multi-level H-bridge Power Amplifier using six (6) devices.

Referring now to FIG. 12, an exemplary configuration of a multi-level H-bridge Power Amplifier using six devices is shown. The six device H-bridge 1202 is comprised of six devices, $FET_{OTL}$ 1204, $FET_{ITL}$ 1206, $FET_{ITR}$ 1208, $FET_{OTR}$ 1210, $FET_{IBL}$ 1212, and $FET_{IBR}$ 1214. The outer-top-left $FET_{OTL}$ 1204 is connected at the drain node to a +6 volt supply 1216. $FET_{OTL}$ 1204 is additionally connected at the source node to $V_{sdl}$ 1218. The inner-top-left $FET_{ITL}$ 1206 is connected at the drain node to a +10 volt supply 1220. $FET_{ITL}$ 1206 is also connected at the source node to $V_{sdl}$ 1218. The inner-bottom-left $FET_{IBL}$ 1212 is connected at the drain node to $V_{sdl}$ 1218 as well. However, $FET_{IBL}$ 1212 is connected at the source node to a ground 1222 as is the source node of $FET_{IBR}$ 1214. The drain node of $FET_{IBR}$ 1214 is connected to $V_{sdr}$ 1224. Both $FET_{ITR}$ 1208 and $FET_{OTR}$ 1210 are connected at their source nodes to $V_{sdr}$ 1224. $FET_{ITR}$ 1208 is connected at the drain node to the +10 volt supply 1220 while $FET_{OTR}$ 1210 is connected at the drain node to the +6 volt supply 1216. A load 1226 is connected between $V_{sdl}$ 1218 and $V_{sdr}$ 1224 as shown. The load 1226 may be connected through series filters 1228 and 1230.

Figure 13:
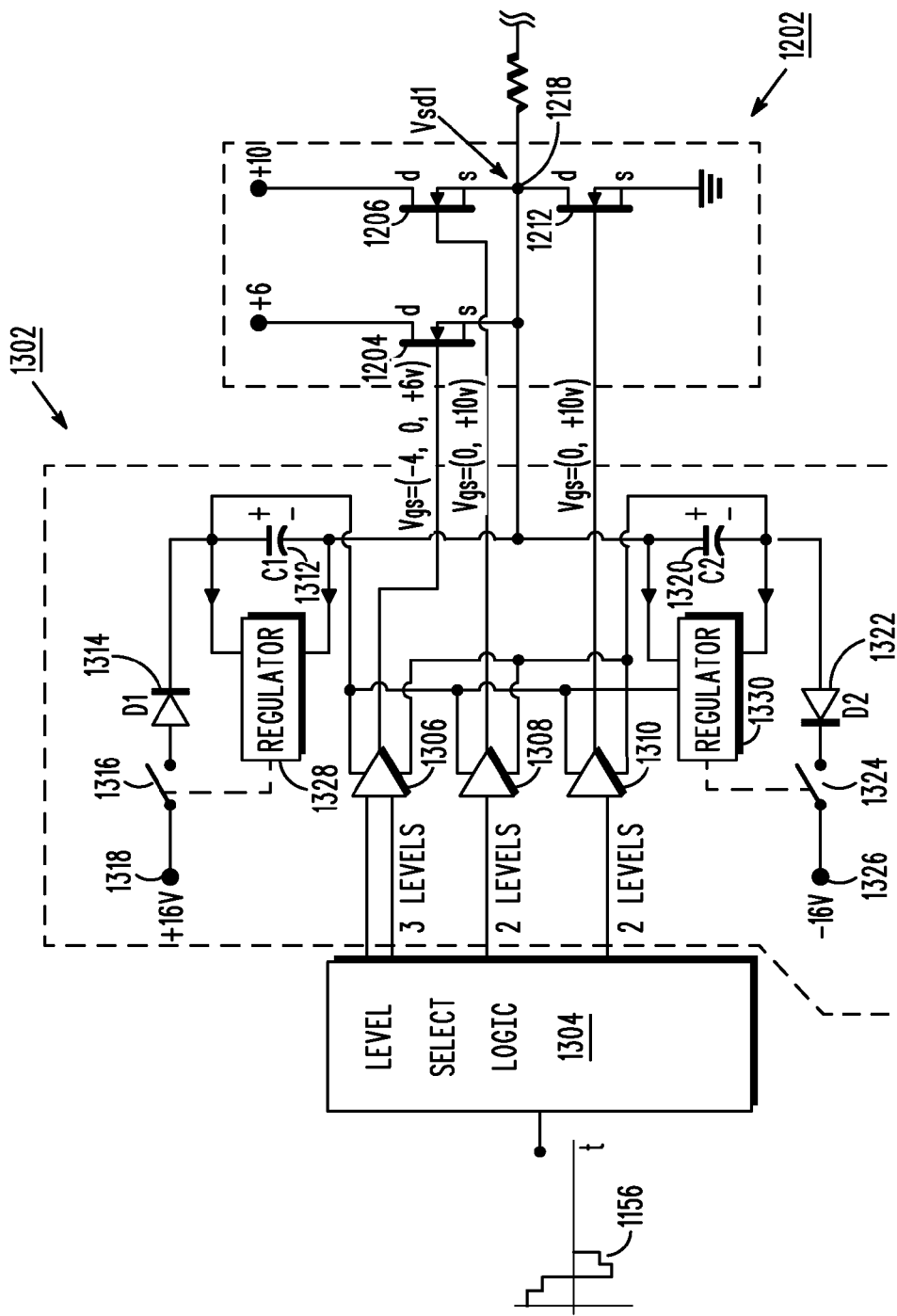
FIG. 13 is an exemplary configuration of a positive-negative floating drive source connected to the 6-device multi-level H-bridge.

Referring now to FIG. 13, an exemplary configuration of a positive-negative floating drive source connected to the six-device multi-level H-bridge is shown. For illustration purposes, only the left half of the six device H-bridge 1202 is shown. However, one of ordinary skill in the art would appreciate that a mirrored configuration exists for the other half of the six device H-bridge 1202. A floating drive source 1302 for a six device H-bridge 1202 is connected between a mapper 1304 and the six device H-bridge 1202. The mapper 1304 can be like the previous mapper's 208, 304, 404 1104 described hereinabove. The mapper 1304 can be one mapper 1304 that drives both halves of the six device H-bridge 1202, or it can be two mappers 1304 wherein one mapper 1304 drives one half of the six device H-bridge 1202 and the other mapper 1304 drives the other half of the six device H-bridge 1202. The floating drive source 1302 has a 3-level top driver 1306, a 2-level top driver 1308, and a 2-level bottom driver 1310. A capacitor C1 1312 is connected on the top node to the cathode of a diode D1 1314 as well as to the top of each of the drivers 1306, 1308, 1310. The capacitor C1 1312 is connected on the bottom node to $V_{sdl}$ 1218. The anode of the diode D1 1314 is connected through a top switch 1316 to a positive-sixteen (+16) volt supply 1318. A bottom node of a capacitor C2 1320 is connected an anode of a diode D2 1322 as well as to the bottom of each of the floating drivers 1306, 1308, 1310. The top node of capacitor C2 1320 is connected to $V_{sdl}$ 1218. The diode D2 1322 is additionally connected through a bottom switch 1324 to a negative-sixteen (−16) volt supply 1326. Additionally, a top regulator 1328 controls the switch 1316 to charge the capacitor C1 1312 capacitance to a minimum supply needed for the drivers 1306, 1308, 1310. A bottom regulator 1330 controls the bottom switch 1324 to the capacitor C1 1320 capacitance to the minimum negative supply needed for the drivers 1306, 1308, 1310.

Whenever $FET_{IBL}$ 1212 is turned on, capacitor C1 1312 charges through the diode D1 1314. Additionally, whenever either $FET_{OTL}$ 1204 or $FET_{ITL}$ 1206 is turned on, the capacitor C2 1320 charges through diode D2 1324. The 3-level top driver 1306 is connected to the gate node of $FET_{OTL}$ 1204. The 2-level top driver 1308 is connected to the gate node of $FET_{ITL}$ 1206. The 2-level bottom driver 1310 is connected to the gate node of $FET_{IBL}$ 1212. Therefore, since the capacitor C1 1312 is connected to the tops of each of the floating drivers 1306, 1308, 1310 and capacitor C2 1320 is connected to the bottom of each of the floating drivers 1306, 1308, 1310, each of the floating drivers is provided with a ± power supply referenced to central node 1218 to drive the devices $FET_{OTL}$ 1204, $FET_{ITL}$ 1206, and $FET_{IBL}$ 1212. The 3-level top driver 1306 is adapted to create a $V_{gs}$ voltage of negative-four (−4) volts, zero (0) volts and positive-six (+6) volts for $FET_{OTL}$ 1204. The 2-level top driver 1308 creates a $V_{gs}$ voltage of zero (0) volts or positive-ten (+10) volts for $FET_{ITL}$ 1206 and the 2-level bottom driver 1310 creates a $V_{gs}$ voltage of zero (0) volts or positive-ten (+10) volts for $FET_{IBL}$ 1212.

The mapper 1304 is adapted to receive the multi-level signal, e.g., a three, four or five level signal 1156 and generate a drive signal to each of the floating drivers 1306, 1308, and 1310. The mapper 1304 can set the 3-level top driver 1306 to one of three states to generate an appropriate $V_{gs}$ of negative-four (−4) volts, zero (0) volts or positive-six (+6) volts, based on the input signal. The mapper 1304 additionally sets the 2-level top driver 1308 and the 2-level bottom driver 1310 to one of two states to generate an appropriate $V_{gs}$ at, zero (0) volts or positive-ten (+10) volts based on the input signal.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A digital to radio frequency amplifier system comprising:
    a bandpass delta sigma modulator for receiving a modulated carrier input and for producing a multilevel modulation signal;
    a level select logic mapper connected to receive said multilevel modulation signal, said level select logic mapper provides a plurality of drive signals; and
    an H-bridge amplifier connected to said plurality of drive signals of said level select logic mapper wherein said H-bridge amplifier is driven by said level select logic mapper.

2. The digital to radio frequency amplifier system of claim 1, further comprising a first bandpass filter connected between said H-bridge amplifier and a load.

3. The digital to radio frequency amplifier system of claim 1, wherein said H-bridge amplifier is a half-bridge amplifier.

4. The digital to radio frequency amplifier system of claim 1, wherein said H-bridge amplifier is a multi-level H-bridge amplifier that comprises:
    a drain node of a first Field Effect Transistor (FET) connected to a first power supply;
    a source node of a said first FET connected to a first load-end bandpass filter;
    a gate node of said first FET connected to a first output of said level select logic mapper;
    a second load-end bandpass filter connected to a source node of a second FET;
    a drain node of said second FET connected to said first power supply;
    a gate node of said second FET connected to a second output of said level select logic mapper;
    a drain node of a third FET connected to said source node of said first FET;
    a source node of said third FET connected to a second power supply;
    a gate node of said third FET connected to a third output of said level select logic mapper;
    a drain node of a fourth FET connected to said source node of said second FET;
    a source node of said fourth FET connected to said second power supply; and
    a gate node of said fourth FET connected to a fourth output of said level select logic mapper.

5. The digital to radio frequency amplifier system of claim 4, wherein said multi-level modulation signal of said multilevel bandpass delta sigma modulator is a 3 level modulation signal.

6. The digital to radio frequency amplifier system of claim 4, wherein said first FET, second FET, third FET, and fourth FET are each a gallium nitride FET.

7. The digital to radio frequency amplifier system of claim 4, wherein the system is implemented using a MMIC process.

8. The digital to radio frequency amplifier system of claim 4, wherein said multi-level H-bridge amplifier further comprises:
    a drain node of a fifth FET connected to a third power supply;
    a source node of a said fifth FET connected to said source node of said first FET;
    a gate node of said fifth FET connected to a fifth output of said level select logic mapper;

a drain node of a sixth FET connected to said third power supply;

a source node of said sixth FET connected to said source node of said second FET; and a gate node of said sixth FET connected to a sixth output of said level select logic mapper.

9. The digital to radio frequency amplifier system of claim 8, wherein said multi-level modulation signal of said multi-level bandpass delta sigma modulator comprises one of a 4 level modulation signal and a 5 level modulation signal.

10. The digital to radio frequency amplifier system of claim 8, where said first FET, second FET, third FET, fourth FET, fifth FET, and sixth FET are each a gallium nitride FET.

11. The device of claim 8, wherein said multi-level H-bridge amplifier further comprises:

a drain node of a seventh FET connected to said source node of said first FET;

a source node of said seventh FET connected to a fourth power supply;

a gate node of said seventh FET connected to a seventh output of said level select logic mapper;

a drain node of a eighth FET connected to said source node of said second FET;

a source node of said eighth FET connected to said fourth power supply; and a gate node of said eighth FET connected to an eighth output of said level select logic mapper.

12. The digital to radio frequency amplifier system of claim 11, wherein said multi-level modulation signal of said multi-level bandpass delta sigma modulator comprises one of is a 4 level modulation signal and a 5 level modulation signal.

13. A method of directly converting a digital signal to a radio frequency and relaying the radio frequency, the method comprising:

receiving a modulated signal;

creating, by a bandpass delta sigma modulator, a multi-level modulated signal based on the received modulated signal;

mapping to an H-bridge power amplifier, the multi-level modulated signal through a level select logic mapper; and providing an amplified digital-RF signal to a load.

14. The method of claim 13, wherein the multi-level modulated signal is a 3 level modulated signal and wherein the H-bridge power amplifier comprises a 4 FET H-bridge power amplifier.

15. The method of claim 13, wherein the 4-FET H-bridge power amplifier is a half-bridge amplifier.

16. The method of claim 13, wherein the H-bridge power amplifier comprises a 6 FET H-bridge power amplifier.

17. The method of claim 16, wherein the 6-FET H-bridge power amplifier is a half-bridge amplifier.

18. The method of claim 13, wherein the H-bridge power amplifier comprises an 8 FET H-bridge power amplifier.

19. A Direct Digital to Radio Frequency (DDRF) system comprising:

a bandpass delta sigma modulator for receiving a modulated carrier input and for producing a multilevel modulation signal, wherein said multi-level modulation signal further comprises a zero state;

a level select logic mapper connected to receive said multilevel modulation signal, said level select logic mapper provides a plurality of drive signals; and an H-bridge amplifier connected to said plurality of drive signals of said level select logic mapper wherein said H-bridge amplifier is driven by said level select logic mapper.

20. The DDRF system of claim 19, wherein said H-bridge amplifier dissipates a stored energy by active commutation when said zero state is generated.

* * * * *